United States Patent [19]
Murai

[11] Patent Number: 5,717,367
[45] Date of Patent: Feb. 10, 1998

[54] SURFACE ACOUSTIC WAVE (SAW) FILTER WITH IMPROVED SPACING BETWEEN INPUT AND OUTPUT INTERDIGITAL TRANSDUCERS

[75] Inventor: Koji Murai, Tokyo, Japan

[73] Assignee: Mitsubishi Denki Kabushiki Kaisha, Tokyo, Japan

[21] Appl. No.: 597,485

[22] Filed: Feb. 2, 1996

[30] Foreign Application Priority Data

Mar. 22, 1995 [JP] Japan .................. 7-62923

[51] Int. Cl.$^6$ .................. H03H 9/64
[52] U.S. Cl. .................. 333/195; 333/193; 310/313 D
[58] Field of Search .................. 333/193–196; 310/313 R, 313 B, 313 C, 313 D

[56] References Cited

U.S. PATENT DOCUMENTS

| | | | |
|---|---|---|---|
| 4,159,435 | 6/1979 | Lewis . | |
| 4,166,258 | 8/1979 | Tseng | 333/195 |
| 5,087,901 | 2/1992 | Kurosawa et al. | 333/193 |
| 5,179,310 | 1/1993 | Satoh et al. | 333/193 |
| 5,300,902 | 4/1994 | Satoh et al. | 333/195 |
| 5,309,126 | 5/1994 | Allen | 333/193 |
| 5,392,013 | 2/1995 | Yamamoto et al. | 333/195 |
| 5,396,199 | 3/1995 | Tera et al. . | |
| 5,426,339 | 6/1995 | Wright | 333/196 |
| 5,463,361 | 10/1995 | Allen | 333/193 |
| 5,485,052 | 1/1996 | Seki et al. | 333/193 |
| 5,521,453 | 5/1996 | Yatsuda | 333/193 |

FOREIGN PATENT DOCUMENTS

| | | |
|---|---|---|
| 0600705 | 6/1994 | European Pat. Off. . |
| 5-267990 | 10/1993 | Japan . |
| 7-038369 | 2/1995 | Japan . |

*Primary Examiner*—Robert Pascal
*Assistant Examiner*—Darius Gambino
*Attorney, Agent, or Firm*—Rothwell, Figgs, Ernst & Kurz

[57] ABSTRACT

A SAW filter is disclosed which includes two reflectors and a group of interdigital transducers (IDTs) located therebetween on a piezoelectric substrate, wherein the IDTs comprises at least four input IDTs and output IDTs alternatively aligned on the substrate in a SAW propagation direction to increase an transducer efficiency between an electronic signal and SAWs. Further, a distance between the center lines of the end electrode fingers of the adjacent input and output IDTs are set to be in a range from 0.625 $\lambda$ to 1.25 $\lambda$ ($\lambda$: wave length of SAW) to establish input and output impedances of the SAW filter.

15 Claims, 20 Drawing Sheets

SPECIFICATION VALUES REQUIRED FOR FILTERS IN 1.5GHz BAND POTABLE TELEPHONE

|  | RECEPTION | TRANSMISSION |
|---|---|---|
| TEMPERARATURE RANGE | −20°C ~ +75°C | |
| CENTRAL FREQUENCY (f0) | 1489MHz | 1441MHz |
| PASS BAND | 24MHz | |
|  | 1477MHz ~ 1501MHz | 1429MHz ~ 1453MHz |

Fig. 5 (PRIOR ART)

TARGET DESIGN VALUES FOR 1.5GHz BAND
RECEPTION/TRANSMISSION FILTERS
(LiNbO₃ PIEZO-ELECTRIC SUBSTRATE USED)

|  | RECEPTION | TRANSMISSION |
|---|---|---|
| TEMPERARATURE RANGE | −20°C ~ +75°C ||
| CENTRAL FREQUENCY (f0) | 1489MHz | 1441MHz |
| PASS BAND | 34MHz ||
|  | 1472MHz ~ 1506MHz | 1424MHz ~ 1458MHz |
| INSERTION LOSS | 3.0dB | 3.0dB |
| ATTENUATION VALUE IN OUTSIDE OF PASS BAND | 5dB (1424MHz ~ 1458MHz) | 6dB (1472MHz ~ 1506MHz) |
|  | 20dB (1602MHz ~ 1637MHz) | 25dB (1602MHz ~ 1637MHz) |

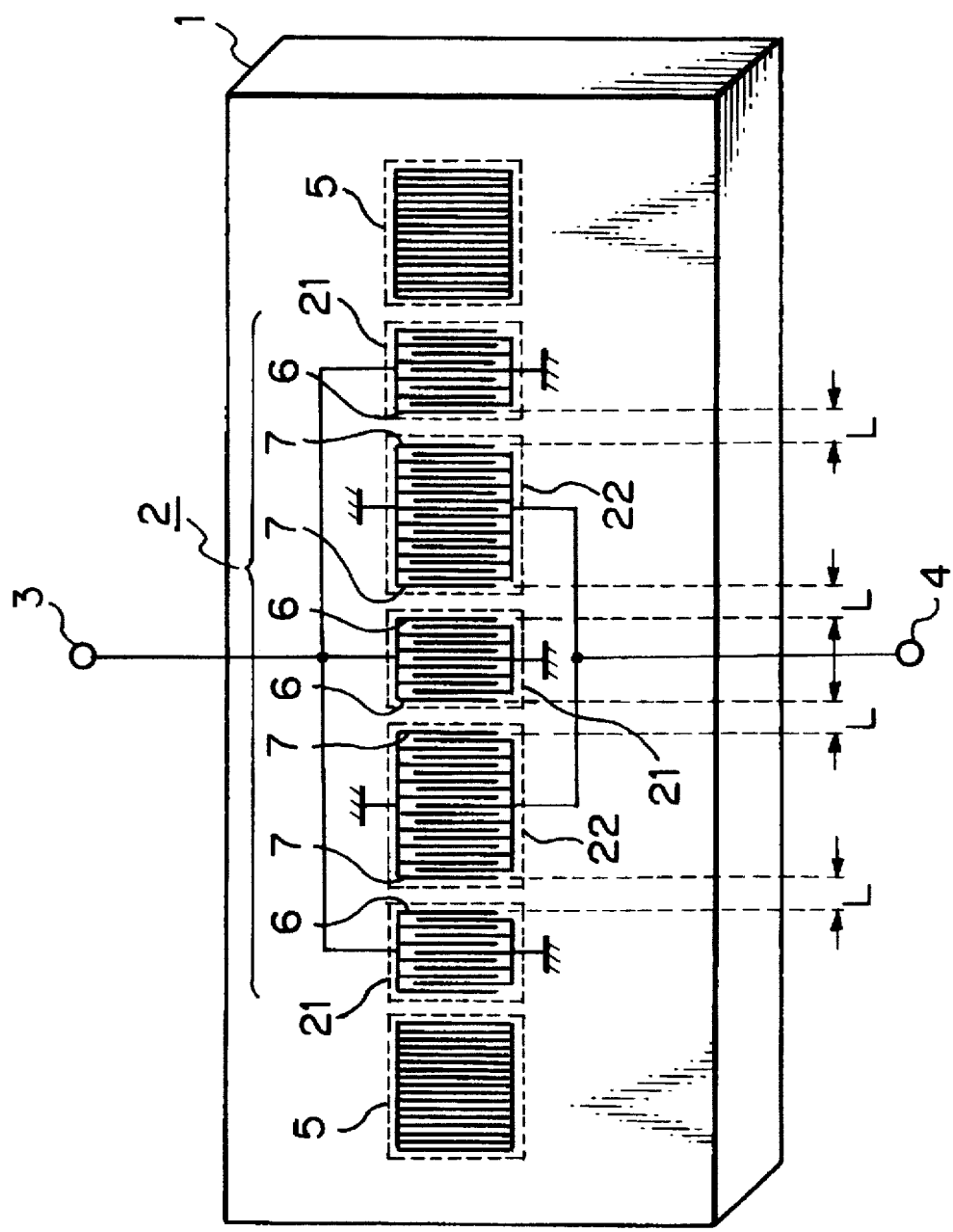

Fig. 9

TARGET DESIGN VALUES FOR 1.5GHz BAND
RECEPTION/TRANSMISSION FILTERS
(LiTaO₃ PIEZO-ELECTRIC SUBSTRATE USED)

|  | RECEPTION | TRANSMISSION |
|---|---|---|
| TEMPERARATURE RANGE | −20°C ~ +75°C | |
| CENTRAL FREQUENCY (f0) | 1489MHz | 1441MHz |
| PASS BAND | 28MHz | |
|  | 1475MHz ~ 1503MHz | 1427MHz ~ 1455MHz |
| INSERTION LOSS | 2.3dB | 2.3dB |
| ATTENUATION VALUE IN OUTSIDE OF PASS BAND | 10dB (1427MHz ~ 1455MHz) | 8dB (1475MHz ~ 1503MHz) |
|  | 35dB (1604MHz ~ 1634MHz) | 35dB (1604MHz ~ 1634MHz) |

$0.625\lambda \leq L \leq 1.25\lambda$

SURFACE ACOUSTIC WAVE (SAW) FILTER WITH IMPROVED SPACING BETWEEN INPUT AND OUTPUT INTERDIGITAL TRANSDUCERS

BACKGROUND OF THE INVENTION

1. Field of the Invention

The present invention relates to a surface acoustic wave (SAW) filter for use in a high frequency circuit incorporated in a mobile communication system or the like.

2. Prior Arts

FIG. 1 illustrates a SAW filter according to a prior art as described in Japanese Patent Public Disclosure (Kokai) No. 5-267990 (1993). In FIG. 1, the numeral 1 denotes a piezoelectric substrate with 64° Y cut and propagation along X direction which is made of LiNbO$_3$, and 2 a group of inter-digital transducers (IDTs) each of which forms with a plurality of electrode fingers inter-digitally arranged on the piezoelectric substrate 1 in the propagation direction of the SAW. The IDTs 2 include an input IDT 21 located at the center thereof and having an input terminal 3, and a pair of output IDTs 22 located at the opposite sides of the input IDT 21 and having an output terminal 4. The numeral 5 designates a pair of reflectors positioned at the opposite sides of the IDTs 2 adapted to confine the SAW within the IDTs 2.

In the prior SAW filter shown in FIG. 1, when high frequency electric signals are provided to the input terminal 3, the signals are transferred to the input IDT 21 and cause the piezoelectric substrate 1 to resonate. As a consequence, SAWs are caused and the occurred SAWs are then propagated on the piezoelectric substrate 1 from the input IDT 21 toward the reflectors 5. Since the SAWs are reflected by the reflectors 5 and multiple reflections occur between the reflectors, resulting in that a resonance at a particular frequency (resonant frequency) is generated. A part of the resonated SAW is received at the output IDTs 22 where it is converted to a high frequency electric signal, and then is output from the output terminal 4.

FIG. 2 shows a relationship between the SAW filter shown in FIG. 1 and amplitudes of SAWs at resonance frequencies propagating on the substrate in the X axis direction. In FIG. 2, the original point 0 is at the left end of the left side reflector 5 and the X direction extends rightwardly therefrom. As shown in FIG. 2, the resonated SAWs comprise those in the primary and tertiary symmetric modes respectively illustrated by solid and dot lines, wherein the resonance frequencies of these modes are different. By setting the difference between these frequencies to a desired value, a band pass filter characteristic is obtained. Since a concrete method of obtaining the characteristic is well-known, it will not be repeated here.

FIG. 3 schematically illustrates frequency-attenuation characteristics (or attenuation characteristics) of such a SAW filter as shown in FIG. 1. As shown in FIG. 3, there is a small attenuation frequency area A adjacent to and higher than a pass band. This is caused because multiple reflections of SAWs in modes different from the primary and tertiary symmetric modes are generated in the frequency area A which is slightly higher than the pass band, and the resonance caused therefrom appears as spurious. In frequency areas B remote from the pass band, considerably large attenuation may be attained in comparison with the area A, due to SAWs in the areas B not being sufficiently resonated at the input IDT 21. However, in some cases such as a mobile communication apparatus, the attenuation in the areas B may not be large enough for a specification required therein.

In order to increase the attenuation in the areas A and B outside of the pass band, it may be considered to connect a plurality of SAW filters in cascade. This method, however, also increases the attenuation in the pass band and hence the insertion loss in the pass band, and thus it may not be considered to be advantageous.

In a conventional SAW filter which is directed to a lower insertion loss, a material of LiNbO$_3$ having a large electro-mechanical coupling factor (herein after, referred to "coupling factor") is generally utilized as a piezoelectric substrate 1 as mentioned above with reference to FIG. 1. The LiNbO$_3$ piezoelectric substrate, however, has a relatively large temperature coefficient "K" of a substrate acoustic velocity "V" and thus the following disadvantages may be derived therefrom.

Assuming that a resonant frequency of a SAW filter is "f" and a wavelength of a SAW propagating on the piezoelectric substrate is "λ", the acoustic velocity V can be represented as V=f·λ. Accordingly, the frequency variation Δf is proportional to the velocity variation Δv, or Δv=Δf·k. The velocity variation Δv can also be expressed as Δv=K·v·ΔT by using the above mentioned temperature coefficient K, where ΔT represents the temperature variation. From the above relationships, the following relation is obtained:

$$\Delta f = K \cdot f \cdot \Delta T \qquad (1)$$

When lower and upper limit frequencies of the pass band at the normal temperature T$_0$ are set to F$_{l(T0)}$ and −F$_{l(T0)}$, which means the pass band width to be equal to F$_{u(T0)}$ −F$_{l(T0)}$, and the SAW filter operates in a temperature range from T$_l$ to T$_u$, a lower limit frequency F$_{l(Tl)}$ at the lower limit temperature T$_l$ will be smaller than F$_{l(T0)}$ by K·F$_{l(T0)}$ ·(T$_0$-T$_l$), according to Equation (1). That is:

$$F_{l(Tl)} = F_{l(T0)} - K \cdot F_l(T_0) \cdot (T_0 - T_l) \qquad (2)$$

On the other hand, an upper limit frequency F$_{u(Tu)}$ at the upper limit temperature T$_u$ will be larger than F$_{u(Tu)}$ by K·F$_u$(T$_0$)·(T$_u$-T$_0$), according to Equation (1). That is;

$$F_{u(Tu)} = F_{u(T0)} + K \cdot F_u \cdot (T_u - T_0) \qquad (3)$$

For the above reason, in order that an apparatus employing a SAW filter, such as a portable telephone set, satisfies a specification value for a pass band width in the full usable temperature range (hereinafter, referred to "specification pass band width"), it is required to set a design value of the pass band width (hereinafter, referred to "design pass band width") to be wider than the specification pass band width. It is noted that an extent of the pass band design width should be larger, as the central frequency of the pass band to be required is higher.

By taking an example of a portable telephone set with 1.5 GHz band, the above problem will be further explained. FIG. 4 is a table showing specification values required for designing band pass filters incorporated in a receiver and transmitter (reception and transmission filters) of the 1.5 GHz band portable telephone set. The specification values are a usable temperature range, central frequency, and pass band width. In the example, the specification pass band width and the central frequency f$_0$ of the pass band for the reception filter are 24 MHz and 1489 MHz, respectively, and thus the upper and lower limit frequencies of the pass band are 1477 MHz and 1501 MHz. These specification values have to be satisfied in the temperature range of −20° C.−+75° C.

If an LiNbO$_3$ piezoelectric substrate is employed as a piezoelectric substrate of the reception band pass filter, since its temperature coefficient K is +70 PPM, the lower limit frequency $F_{l(-20)}$ at −20° C. and the upper limit frequency $F_{u(+75)}$ at +75° C. may be obtained from Equations (2) and (3) with normal temperature $T_O$ being +30° C.:

$$\begin{aligned} F_{l(-20)} &= 1477 \text{ MHz} - 70 \text{ PPM} \times 24 \text{ MHz} \times \{30° \text{ C.} - (-20° \text{ C.})\} \\ &= 1477 \text{ MHz} - 5 \text{ MHz} \\ &= 1472 \text{ MHz} \end{aligned}$$

$$\begin{aligned} F_{u(+75)} &= 1501 \text{ MHz} + 70 \text{ PPM} \times 24 \text{ MHz} \{+75° \text{ C.} - 30° \text{ C.})\} \\ &= 1501 \text{ MHz} + 5 \text{ MHz} \\ &= 1506 \text{ MHz} \end{aligned}$$

Accordingly, the design pass band width of the reception filter becomes 34 MHz which is wider than the specification pass band width by 10 MHz. Additionally, in the case that the width of the pass band of the filter is increased, the skirt characteristics thereof become gentle, and thus it is difficult to take sufficient attenuation at the frequency ranges outside of the pass band. The same problems as in the reception filter occur in the transmission filter.

FIG. 5 shows a table illustrating target design values for the reception and transmission filters, of a temperature range, central frequency, pass band width, insertion loss in the pass band and attenuation value in the outside of the pass band, the specification of which is shown in the table of FIG. 4. It is seen from FIG. 5 that regarding the reception filter, the target design attenuation value in the frequency area from 1424 MHz to 1458 MHz is only 5 dB, due to the skirt characteristics being gentle because of the widened pass band width. This frequency range is in the vicinity of the pass band for the reception filter while it is overlapped to the target design pass band for the transmission filter. Accordingly, there is a possibility that interference from/to the receiver to/from the transmitter may be caused.

Further, as to the target design attenuation value in the frequency range from 1602 MHz to 1637 MHz for the reception filter, which is far from the pass band, it is only 20 dB. With regard to the transmission filter, the similar low attenuation characteristics in the outside of the pass band may be derived.

FIGS. 6(A) and 6(B) are graphs showing measurement results of attenuation characteristics of a conventional SAW band pass filter which has been formed to have such a constitution as illustrated in FIG. 1 and to satisfy the target design values enumerated in FIG. 5. That is, the SAW filter comprises an LiNbO$_3$ piezoelectric substrate of 64° Y cut and X axis propagation characteristic, three input and output IDTs formed on the piezoelectric substrate, and two reflectors constituted with 250 electrode fingers at the opposite sides of the IDTs on the substrate. FIG. 6(A) shows the attenuation characteristics in the pass band, while FIG. 6(B) designates those in the outside of the pass band. It can be seen from these graphs that the skirt characteristics are gentle due to the pass band being widened.

As explained above, a SAW filter according to a prior art has such a problem that attenuation in the outside of a pass band becomes small due to temperature characteristics of a piezoelectric substrate. Further, if a plurality of SAW filters are connected in cascade in order to obtain substantially large attenuation in the outside of the pass band, there is raised such a problem as resulting in a larger insertion loss in the pass band. In addition thereto, since the pass band in the SAW filter has to be widened in order to satisfy the specification pass band width in a full predetermined temperature range, setting of the design pass band width becomes difficult.

SUMMARY OF THE INVENTION

It is an object of this invention to provide a SAW filter which corrects the problems set forth above, thereby an insertion loss in a pass band is made small, an attenuation value in the outside of the pass band is made large, and a design of the pass band width is made easier.

This object is achieved by a SAW filter according to the present invention which comprises:

a piezoelectric substrate;

at least four input and output interdigital transducers (IDTs) alternatively aligned on said substrate in a SAW propagation direction and being respectively connected to input and output terminals of said SAW filter; and two reflectors positioned at the opposite sides of said IDTs on said substrate, wherein a distance between the center lines of electrode fingers at the inner ends of the adjacent input and output IDTs is set to be within a range from 0.625 λ to 1.25 λ, where λ denotes a wave length of a resonant frequency of the SAW filter.

In the SAW filter, it is preferred that the number of the input and output IDTs is an odd number equal to or more than five, and the substrate is made by LiTaO$_3$ having 36° Y cut and X axis SAW propagation characteristic.

Further, in an embodied SAW filter, at least a resonator is additionally included which has a pair of terminals respectively connected to the input or output terminal of the SAW filter and the input or output IDTs, and an anti-resonant frequency of which is set to be substantially the same as a frequency of a primary upper sidelobe of a main filter part comprising the IDTs and reflectors, whereby the primary upper sidelobe is suppressed. The resonator is preferably constituted on the substrate and consists of an IDT and two reflectors at the opposite sides of the IDT.

Furthermore, in another embodied SAW filter, at least a resonator is additionally included which has a pair of terminals respectively connected to the input or output terminal of the SAW filter and ground, and a resonant frequency of which is set to be substantially the same as a frequency of a primary lower sidelobe of a main filter part comprising the IDTs and reflectors, whereby the primary lower sidelobe is suppressed. The resonator is preferably constituted on the substrate and consists of an IDT and two reflectors at the opposite of the IDT.

In a further embodied SAW filter, a first resonator having a pair of terminals respectively connected to the input terminal of the SAW filter and the input IDTs and a second resonator having a pair of terminals respectively connected to the output terminal of the SAW filter and ground, wherein an anti-resonant frequency of the first resonator is set to be substantially the same as a frequency of a primary upper sidelobe of a main filter part comprising the IDTs and reflectors, and a resonant frequency of the second resonator is set to be substantially the same as a frequency of a primary lower sidelobe of the main filter part, whereby the primary upper and lower sidelobes are suppressed. It is preferred that each of the first and second resonators is constituted on the substrate and consists of an IDT and two reflectors at the opposite sides of the IDT. It is possible to connect the terminals of the first resonator to the output terminal and the output IDTs and to connect the terminals of the second resonator to the input terminal and ground.

BRIEF DESCRIPTION OF THE DRAWINGS

FIG. 5 illustrates design values corresponding to the specification values shown in FIG. 4 in a case that the reception and transmission SAW filters are constituted in line with the prior SAW filter shown in FIG. 1;

FIG. 7 illustrates a constitution of a SAW filter according to an embodiment of the present invention;

FIG. 9 is a table showing design values corresponding to the specification values illustrated in FIG. 4 in a case that the reception and transmission SAW filters are constituted according to the first embodiment shown in FIG. 7;

FIG. 14(C) illustrates attenuation characteristics of the second embodiment;

FIG. 18(C) illustrates attenuation characteristics of the whole third embodiment;

DESCRIPTION OF THE PREFERRED EMBODIMENTS

By referring to FIGS. 7–21, preferred embodiments of the present invention will now be explained.

Figure 1:
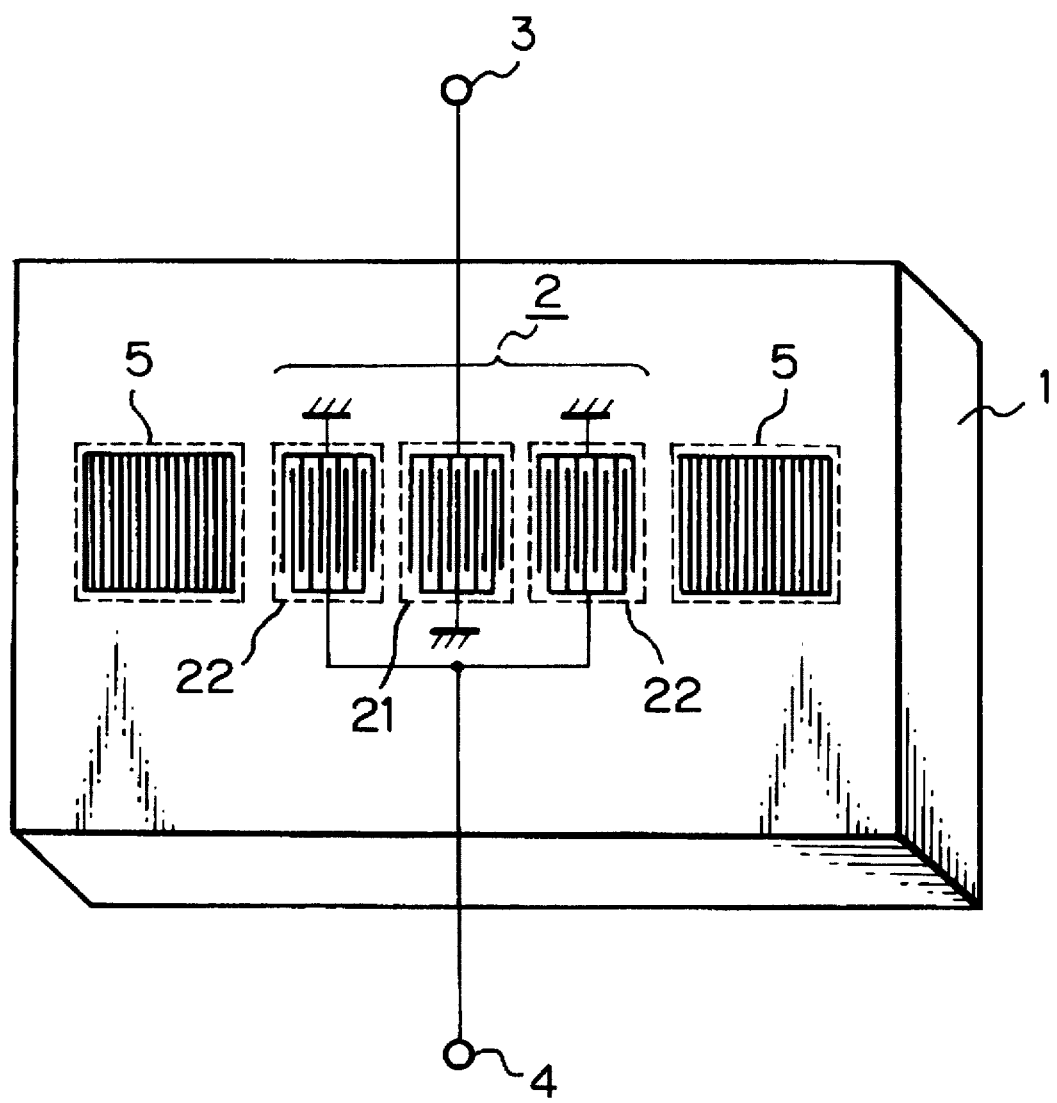
FIG. 1 illustrates a constitution of a SAW filter according to a prior art.
Figure 2:
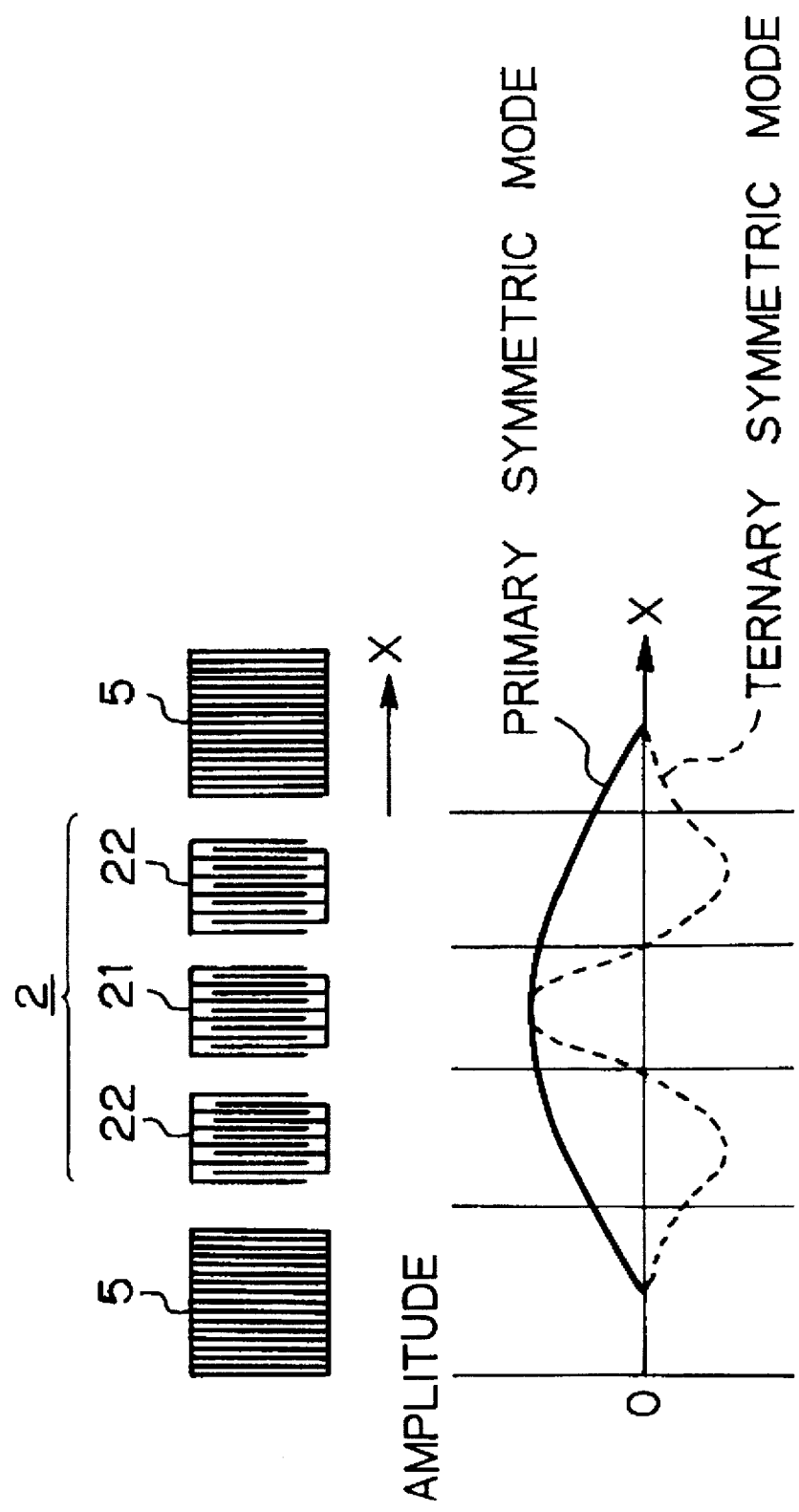
FIG. 2 is an explanatory diagram showing amplitudes of SAWs propagating in the direction of an X axis of the prior SAW filter shown in FIG. 1.

FIG. 7 illustrates a constitution of an embodiment of a surface acoustic wave (SAW) filter according to the present invention. In FIG. 7, the reference numeral designates a piezoelectric substrate which has 36° Y cut and X axis propagation characteristic and has been made from $LiTaO_3$. The coupling factor of $LiTaO_3$ is small as compared with that of $LiNbO_3$ employed in such a prior art as shown in FIG. 1. The reference numeral 2 denotes a group of IDTs consisting of three input IDTs 21 which are located at the central position on the substrate 1 and the opposite sides of the group, and two output IDTs 22 which are disposed between the central input IDT and the opposite side input IDTs. Accordingly, the group of the IDTs 2 are made up five IDTs in total and the input IDTs 21 and the output IDTs 22 are alternatively arranged on the piezoelectric substrate along the propagation direction of SAWs. The input IDTs 21 are connected to an input terminal 3 while the output IDTs 22 are connected to an output terminal 4. The respective IDTs are formed with electrode fingers arranged in a manner of a pair of so-called comb structures. The reference numeral 5 designates two reflectors provided at the opposite sides of the IDTs 2 and adapted to confine the SAWs within the IDTs 2. The reference numeral 6 designates electrode fingers located at sides of the input IDTs 21 and, the reference numeral 7 designates electrode fingers located at sides of the output IDTs 22, wherein the electrode fingers 6 and 7 face to each other with distance of "L". Preferred values of the distance L will be explained after with reference to FIG. 10.

According to the present embodiment, the IDTs 2 is comprised of five IDTs, which is increased by two as compared with the prior art including three IDTs shown in FIG. 1. This is because, since the coupling factor of the $LiTaO_3$ piezoelectric substrate 1 used in the embodiment is smaller than that of the $LiNbO_3$ piezoelectric substrate used in the prior art and thus the insertion loss is increased in the present embodiment, the increased insertion loss is compensated by increasing the quantity of the IDTs 2.

In the SAW filter constituted according to the present embodiment, since the basic operation with respect to the resonance and reception of SAWs is the same as that of the prior SAW filter illustrated in FIG. 1, explanation thereof will not be repeated here.

Figure 8:
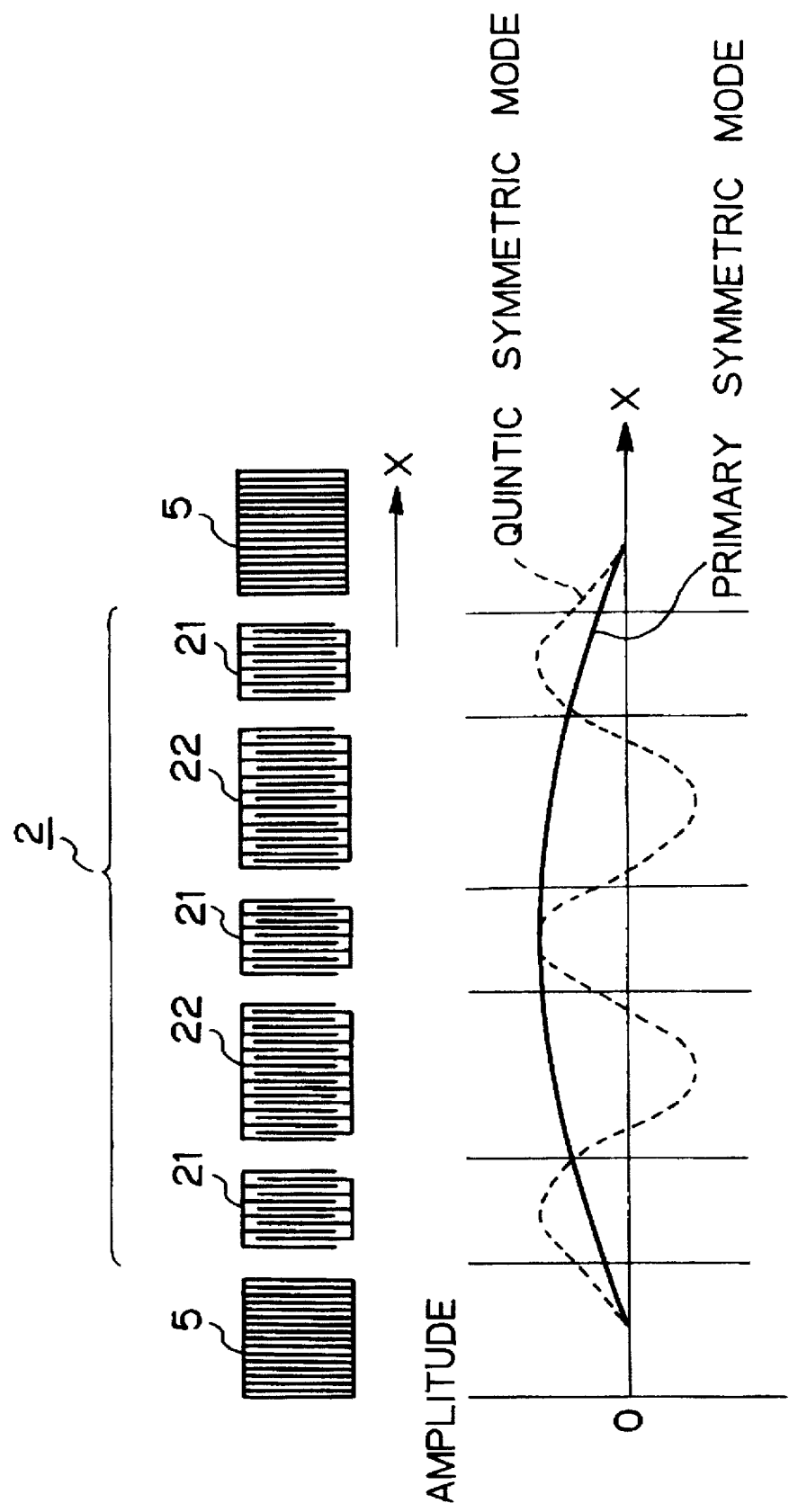
FIG. 8 is an explanatory diagram showing amplitudes of SAWs propagating in the direction of X axis of the SAW filter shown in FIG. 7.

FIG. 8 shows the distribution of amplitude of the SAWs in the propagation direction or X axis at resonance frequencies with reference to the SAW filter shown in FIG. 7. As shown in FIG. 7, according to the first embodiment, the SAWs are generated in the primary and quintic symmetric modes which are illustrated by the solid and dot lines respectively. The resonance frequencies in these modes are different from each other and it is possible to acquire a SAW band pass filter by making the difference between these resonance frequencies a desired value.

Figures 3, 4:
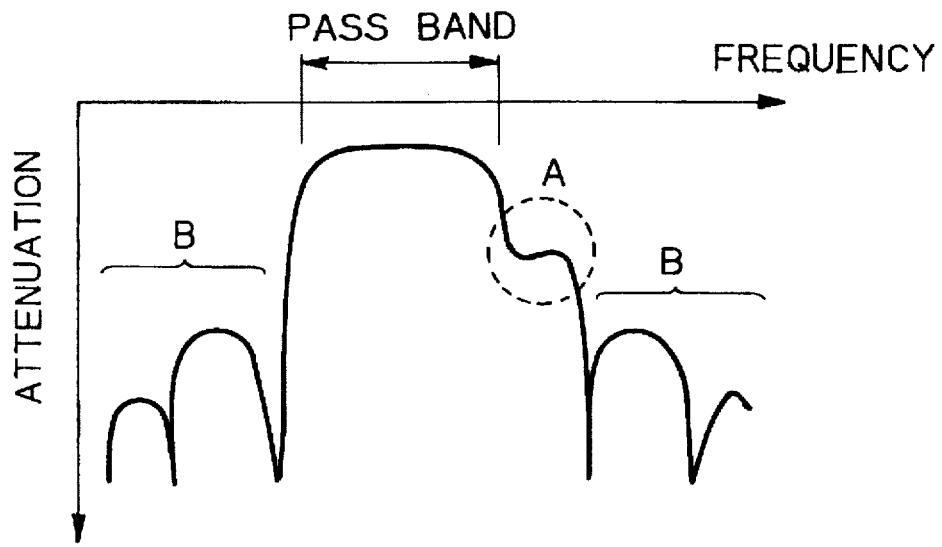
FIG. 3 is an explanatory graph showing attenuation characteristics of the prior SAW filter shown in FIG. 1;.
FIG. 4 is a table illustrating an example of specification values required in reception and transmission filters for a portable telephone.

FIG. 9 is a table showing target design values of 1.5 GHz band reception/transmission filters which employ $LiTaO_3$ piezoelectric substrates, where the associated specification values are listed in the table of FIG. 4. The target design values are an usable temperature range, central frequencies, pass bands, insertion loss in the pass bands and attenuation values in ranges out of the pass bands. Since the temperature coefficient K of an LiTaO$_3$ piezoelectric substrate is +28 PPM, the variation in frequency depending on temperatures is smaller than that of an LiNbO$_3$ piezoelectric substrate and hence a pass band design value of a SAW filter employing the former substrate may be smaller than that of the latter substrate.

For example, if the design band pass width of the LiTaO$_3$ SAW reception filter is calculated using the above Equations (2) and (3) and the specification values shown in FIG. 4, since the usable temperature range is from −20° C. to +75° C., the lower limit frequency of the pass band is smaller than the specification value of 1477 MHz by 2 MHz (=1477 MHz×28 PPM×(30° C.-(−20° C.)) and the upper limit value of the same is larger than the specification value of 1501 MHz by 2 MHz (=1501 MHz×28 ppm×(75° C. −30° C.)). Accordingly, the design pass band width for the reception filter is 28 MHz, that is from 1475 MHz to 1503 MHz, as shown in FIG. 9. Although the target design pass band width has to be widened by 4 MHz as compared to the specification one in the LiTaO$_3$ SAW reception filter, the target pass band width is narrowed by 6 MHz as compared to 34 MHz in the case of the LiNbO$_3$ SAW reception filter (see FIG. 5).

Therefore, the skirt characteristics in the LiTaO$_3$ SAW filter will be steep, and thus the attenuation in ranges out of the pass band will be larger than that in the prior LiNbO$_3$ SAW filter. The same advantages can be also derived in the LiTaO$_3$ transmission filter.

Figure 10:
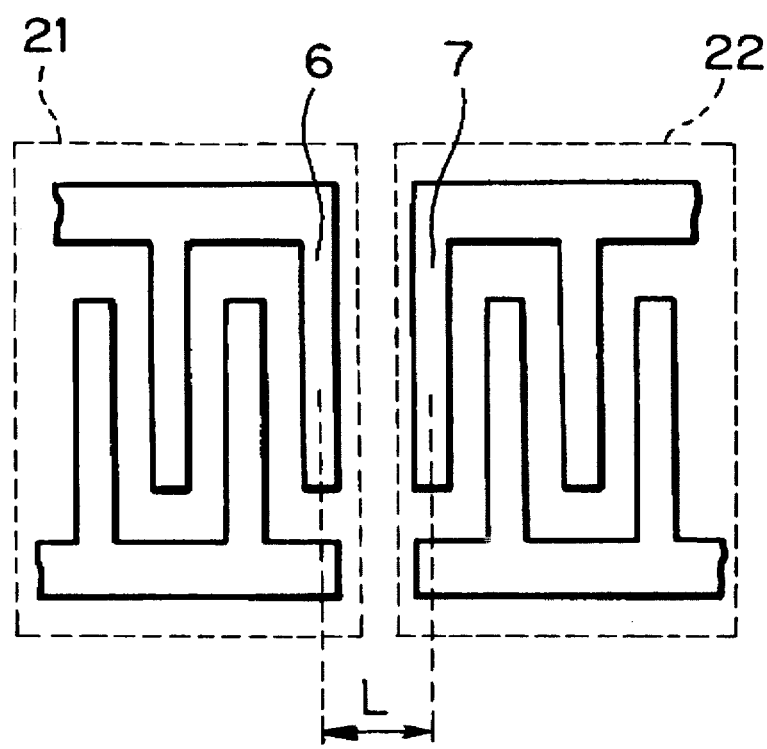
FIG. 10 illustrates the relationship between input and output IDTs of the first embodiment shown in FIG. 7, wherein the reference symbol L denotes a distance between the centers of the end electrode fingers thereof.

FIG. 10 is an enlarged view of a part of the IDTs 2 of the embodied SAW filter shown in FIG. 7. In the SAW filter, the distance L between the centers of the end electrode fingers 6 and 7 of the input and output IDTs 21 and 22 is selected to be in a range from 0.625 λ to 1.25 λ where λ is a wave length of SAW. This distance range has been practically determined by preparing several kinds of the SAW filters shown in FIG. 7, which have different dimensions for the distance L, and by measuring insertion losses and pass band widths thereof. When the distance L is selected to be within the range from 0.625 λ to 1.25 λ, since input and output impedances of the SAW filter are near to 50 Ω, the insertion loss becomes comparatively small. On the other hand, if the distance L goes out of the range, since the input and output impedances depart from 50 Ω, the insertion loss becomes larger. In general, the characteristic impedance of a device used in a microwave band (or equal to or above the UHF band) is 50 Ω, and therefore the SAW filter having an impedance matching with an external circuit will be provided by establishing the distance L within the range of 0.625 λ to 1.25 λ as shown in FIG. 10.

Figure 6A:
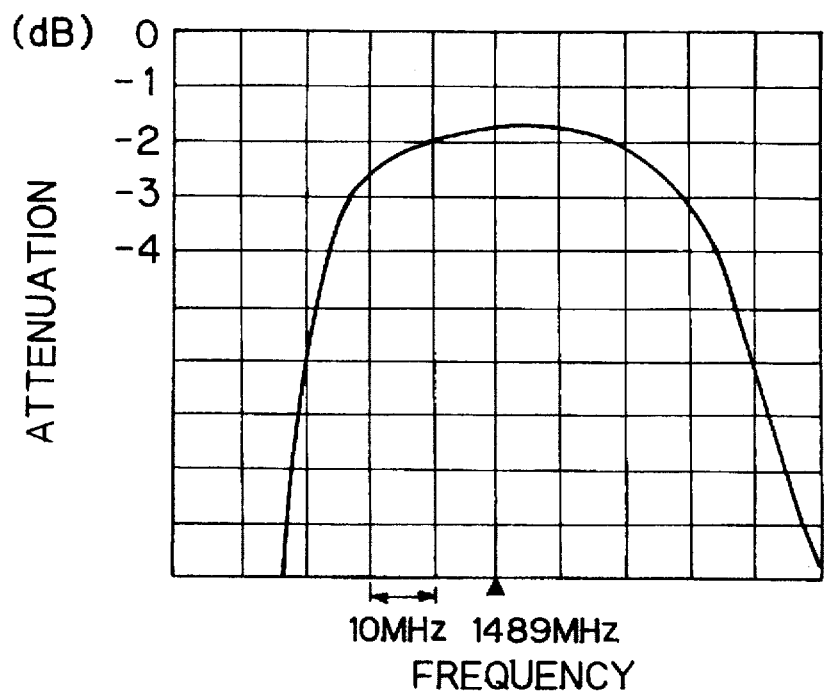
FIGS. 6(A) and 6(B) are graphs showing measurement results of attenuation characteristics of a prior SAW filter as shown in FIG. 1 which has been constituted to satisfy the design values shown in FIG. 5.
Figure 6B:
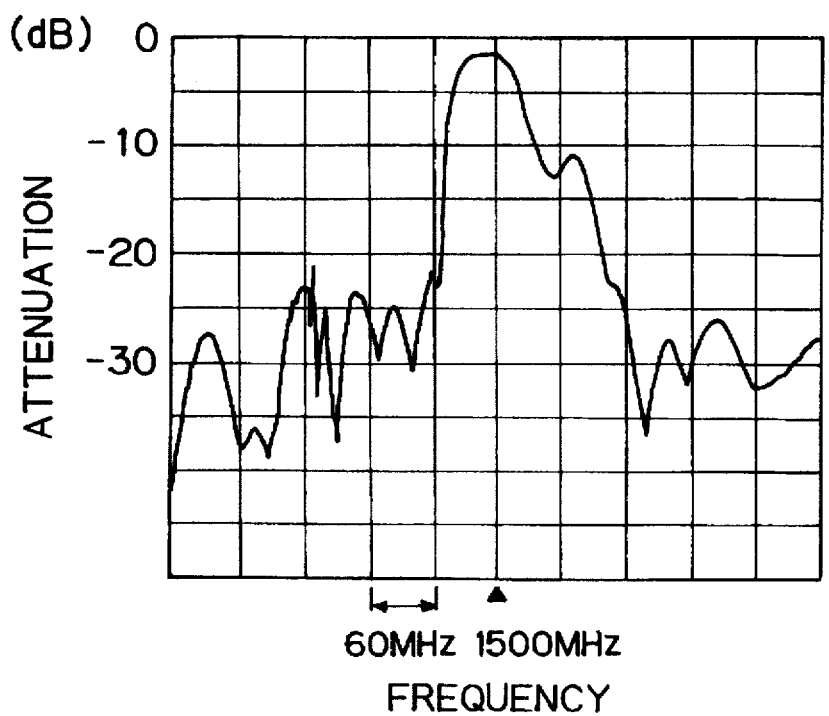
Figure 11A:
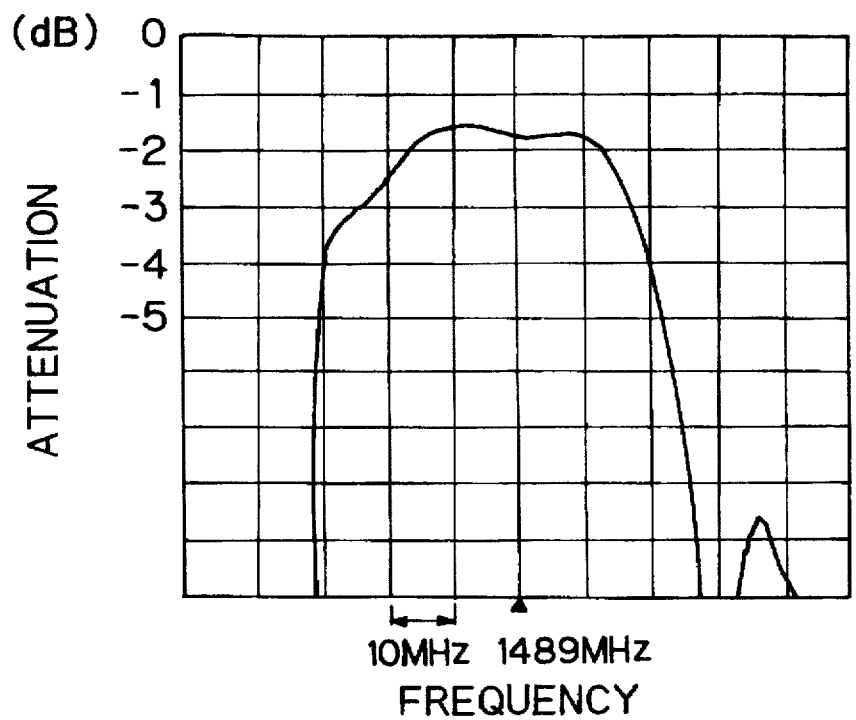
FIGS. 11(A) and 11(B) are graphs showing measurement results of attenuation characteristics of a SAW filter which has been constituted according to the first embodiment shown in FIG. 7.
Figure 11B:
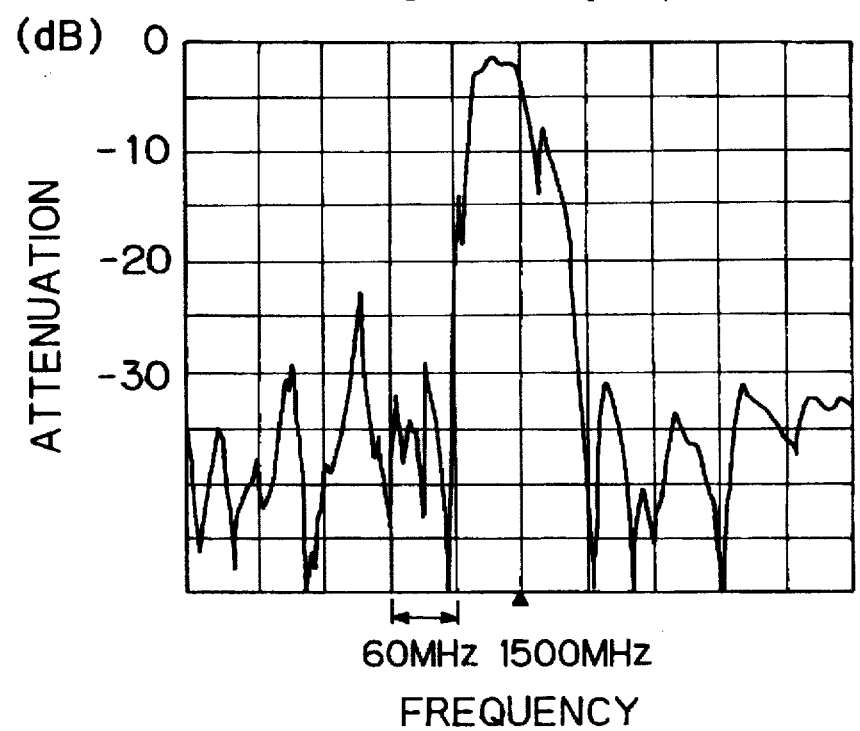

In accordance with the first embodiment shown in FIG. 7 with the target design values enumerated in FIG. 9 and with the distance L within the range of 0.625 λ to 1.25 λ, a trail product of a SAW filter has been manufactured. That is, five IDTs as the group of the IDTs 2 were formed on an LiTaO$_3$ piezoelectric substrate with 36° Y cut and X axis propagation characteristic and two reflectors each constituted by 100 electrode fingers positioned at the opposite sides of the IDTs 2 on the substrate. Measurement results of attenuation characteristics (or frequency to attenuation characteristics) of the manufactured SAW filter are shown in FIGS. 11(A) and 11(B), graphs in which respectively illustrate the characteristics within the pass band and the outsides of the pass band. Comparing FIGS. 11(A) and 11(B) with FIGS. 6(A) and 6(B). It is apparent that the SAW filter according to the embodiment of the present invention results in a smaller insertion loss in the pass band while a larger attenuation in the outsides of the pass band than the prior art as explained by referring to FIG. 1. These advantages are due to the fact that the number of IDTs has been increased, the design pass band width has been narrowed and the skirt characteristics have been steep, as compared with the prior art.

Figure 12:
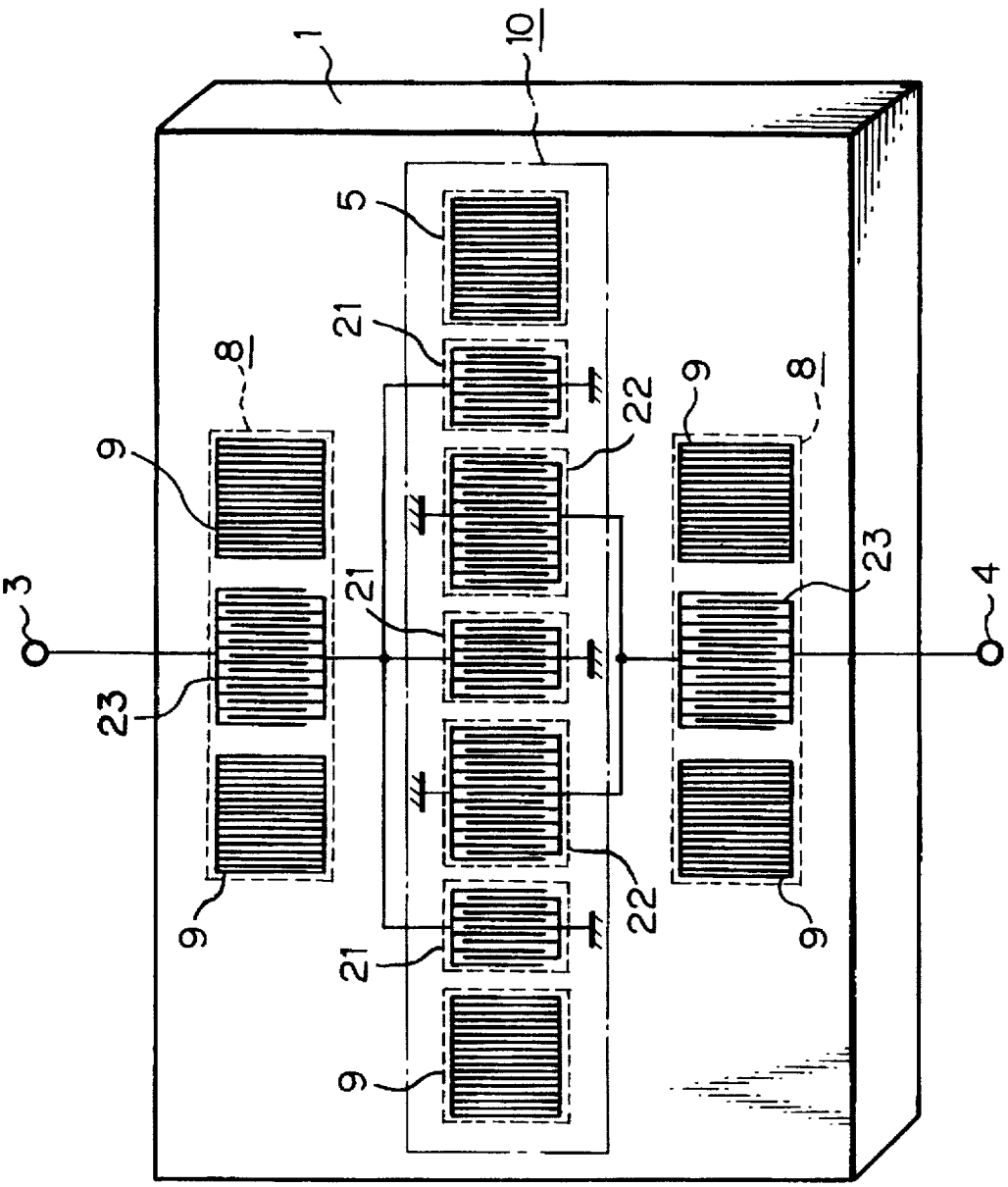
FIG. 12 illustrates a constitution of a SAW filter according to a second embodiment of the present invention.

FIG. 12 illustrates a constitution of a SAW filter according to a second embodiment of the present invention. In FIG. 12, numerals 1–5, 21 and 22 designate the same or identical components as those of the first embodiment shown in FIG. 7 and numeral 10 denotes a main filter part. That is, the main filter part 10 has the same constitution as the SAW filter shown in FIG. 7 and is arranged on the LiTaO$_3$ piezoelectric substrate 1 with 36° Y cut and X axis propagation characteristic. In the second embodiment, a pair of SAW resonators 8 are respectively provided between the input terminal 3 and the input IDTs 21 and between the output terminal 4 and the output IDTs 22. Each of the resonators 8 is comprised of a central IDT 23 and reflectors 9 located at the opposite sides of the IDT 23 and has a pair of terminals connected to the input or output terminal 3 or 4 and the input or output IDTs 21 or 22.

Figure 13:
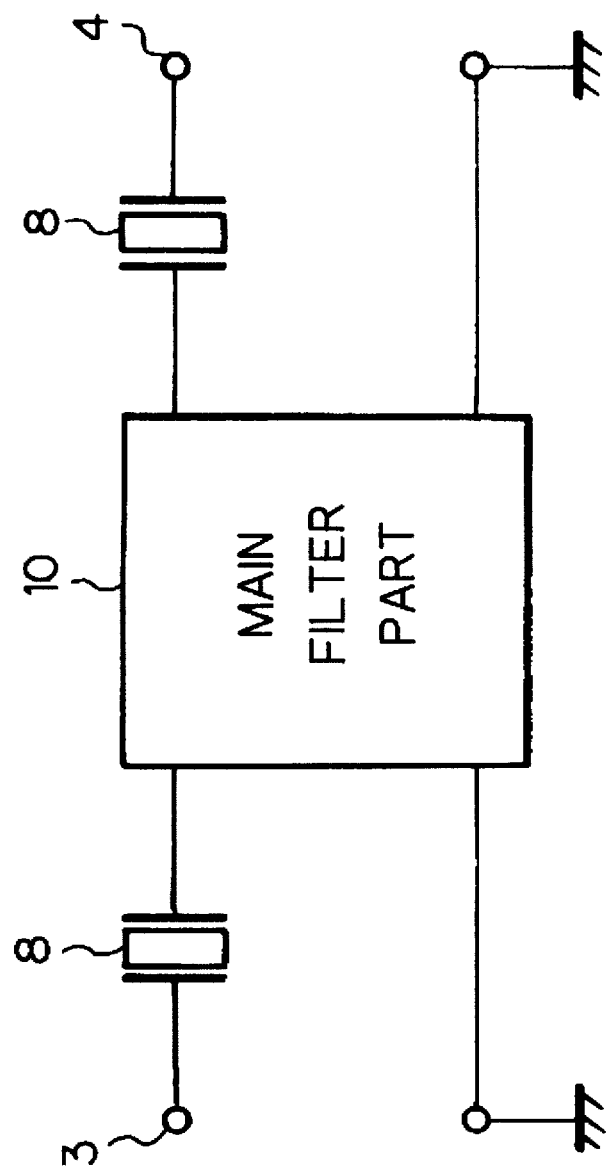
FIG. 13 is an explanatory sketch explaining a function of SAW resonators incorporated in the second embodiment shown in FIG. 12.

An operation of the SAW filter according to the second embodiment will now be explained. It is considered in view of the signal transmission route of the SAW filter that each of the SAW resonators 8 is connected in series between the input or output terminal 3 or 4 and the main filter part 10 as shown in FIG. 13. Accordingly, an electric signal having a resonant frequency fr of the resonator 8 input to the input terminal 3 is caused to pass to the output terminal 4 through the resonator 8 without substantial attenuation, while an electric signal having an anti-resonant frequency fa of the resonator 8 is caused substantially not to pass to the output terminal 4, resulting in attenuation extremity at fa.

Figure 14A:
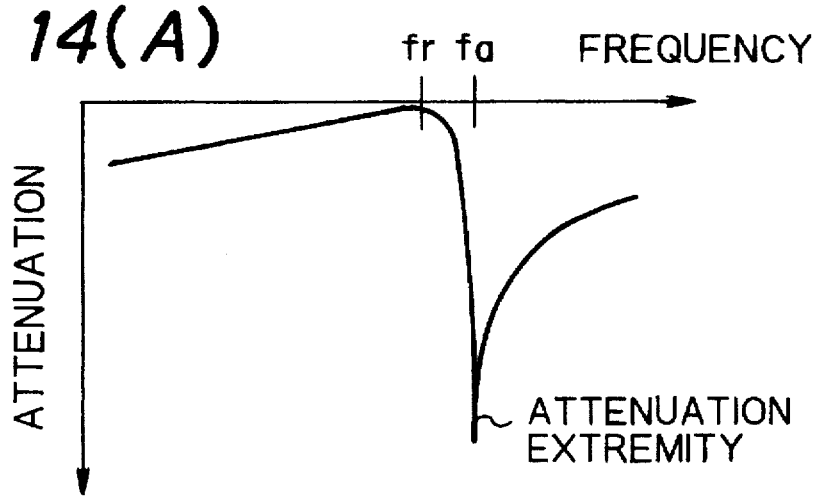
FIGS. 14(A)–14(C) are explanatory graphs explaining an operation of the second embodiment, wherein FIGS. 14(A) and 14(B) respectively show attenuation characteristics of the SAW resonators and a main filter part of the second embodiment
Figure 14B:
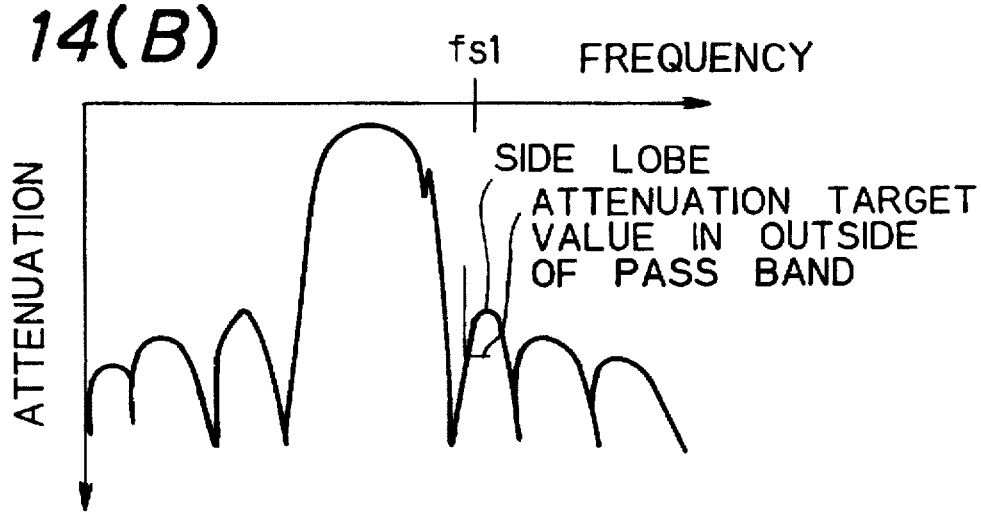

Such attenuation (or transmission) characteristics of the resonator 8 as above are illustrated in FIG. 14(A). In the meantime, the main filter part 10 shown in FIG. 12 exhibits attenuation characteristics as illustrated in FIG. 14(B) and has a sidelobe at a frequency fs1 immediately higher than the pass band, or a primary upper sidelobe. The attenuation characteristics of the main filter part 10 are the same as those shown in FIGS. 11(A) and 11(B) and explained with reference to the first embodiment.

Figure 14C:
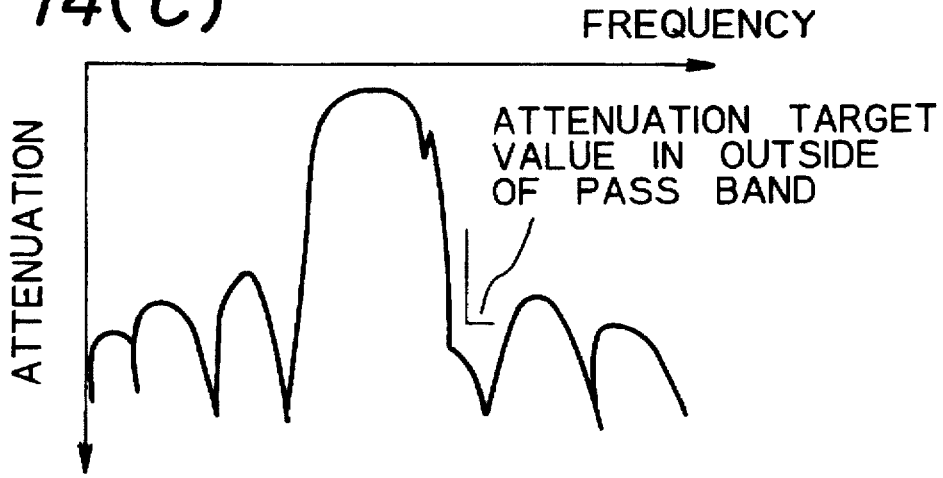

It is to be noted here that if the SAW resonator 8 having a pair of terminals and the main filter part 10 in FIG. 12 are so constructed that the anti-resonant frequency fa of the attenuation extremity shown in FIG. 14(A) and the frequency fs1 of the primary upper sidelobe shown in FIG. 14(B) is substantially equal, since the SAW resonator 8 and the main filter part 10 are connected in series with each other, the sidelobe at the frequency fs1 of the main filter part 10 will be suppressed by the attenuation extremity at the frequency fa of the SAW resonator 8 and thus the attenuation at the higher side out of the pass band will be made larger as shown in FIG. 14(C).

Furthermore, since the resonant frequency fr of the resonator 8 will be existed in the pass band of the main filter part 10, the additional insertion loss in the pass band increased by adding the resonators 8 to the main filter part 10 will be small. Accordingly, the total insertion loss in the pass band can be lowered as compared with the case that a plurality of main filter parts 10 are connected in multiple stages.

From the afore-mentioned explanation, the second embodiment shown in FIG. 12 is constituted such that the anti-resonant frequency fa of the SAW resonators 8 is substantially the same as the frequency fs1 of the primary upper sidelobe of the main filter part 10, thereby the attenuation characteristics as shown in FIG. 14(C) can be attained. It will be obvious to any expert in the field that it is possible to delete either one of the resonators 8 in the first embodiment.

Figure 15A:
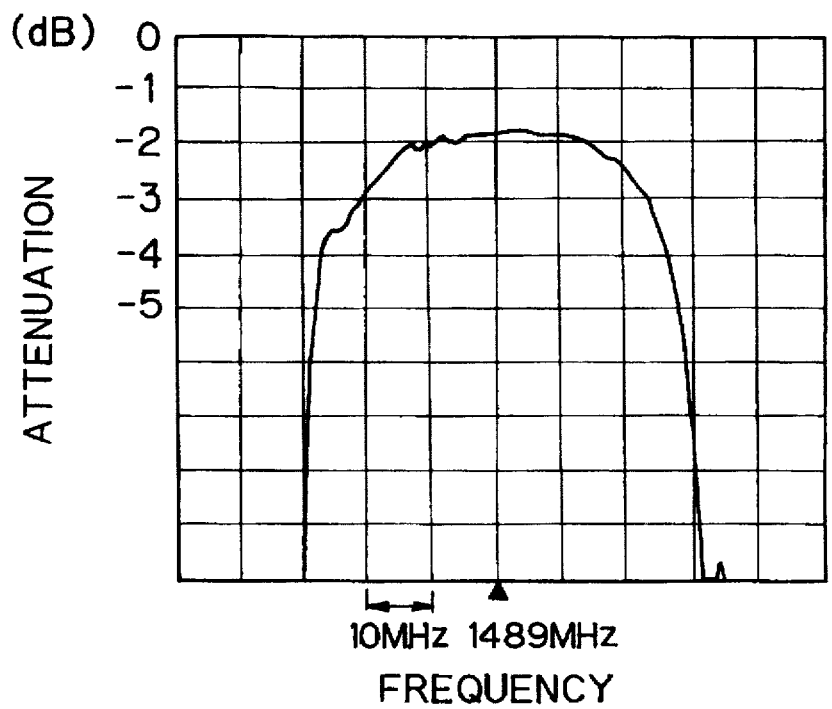
FIGS. 15(A) and 15(B) are graphs showing measurement results of attenuation characteristics of a SAW filter which has been constituted in line with the second embodiment shown in FIG. 12.
Figure 15B:
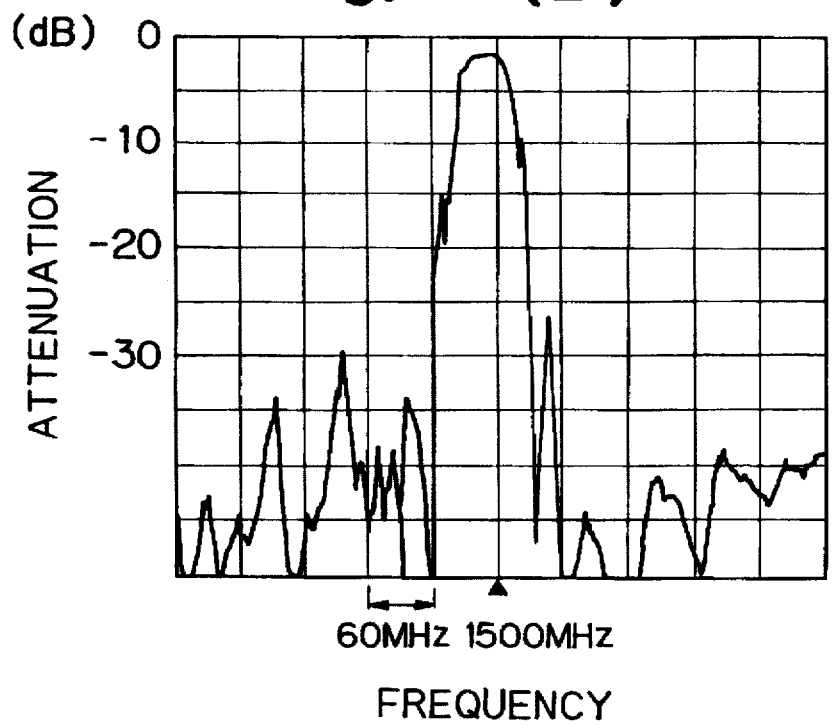

FIGS. 15(A) and 15(B) illustrate measurement results of the attenuation characteristics of a SAW filter which was constituted for testing in accordance with the second embodiment. The piezoelectric substrate 1 and the main filter part 10 were constituted in the same manner as those of the SAW filter according to the first embodiment. Each of the SAW resonators 8 is constituted in such a manner that the central IDT 23 is comprised of 161 electrode fingers and each of the reflectors 9 is comprised of 100 electrode fingers. Further, the anti-resonant frequency fa of the resonator 8 was set at 1535 MHz. From FIGS. 15(A) and 15(B), it is seen that the insertion loss in the pass band of the second embodiment is almost the same as shown in FIGS. 11(A) and 11(B) and the attenuation value in the vicinity of 1535 MHz which is outside of the pass band is substantially large.

As explained above, according to the second embodiment of the present invention, a SAW filter having a low insertion loss in the pass band and having a large attenuation in the outside of the pass band will be provided. Even if one of the resonators 8 is deleted from the second embodiment, the operation and function will be substantially maintained.

Figure 16:
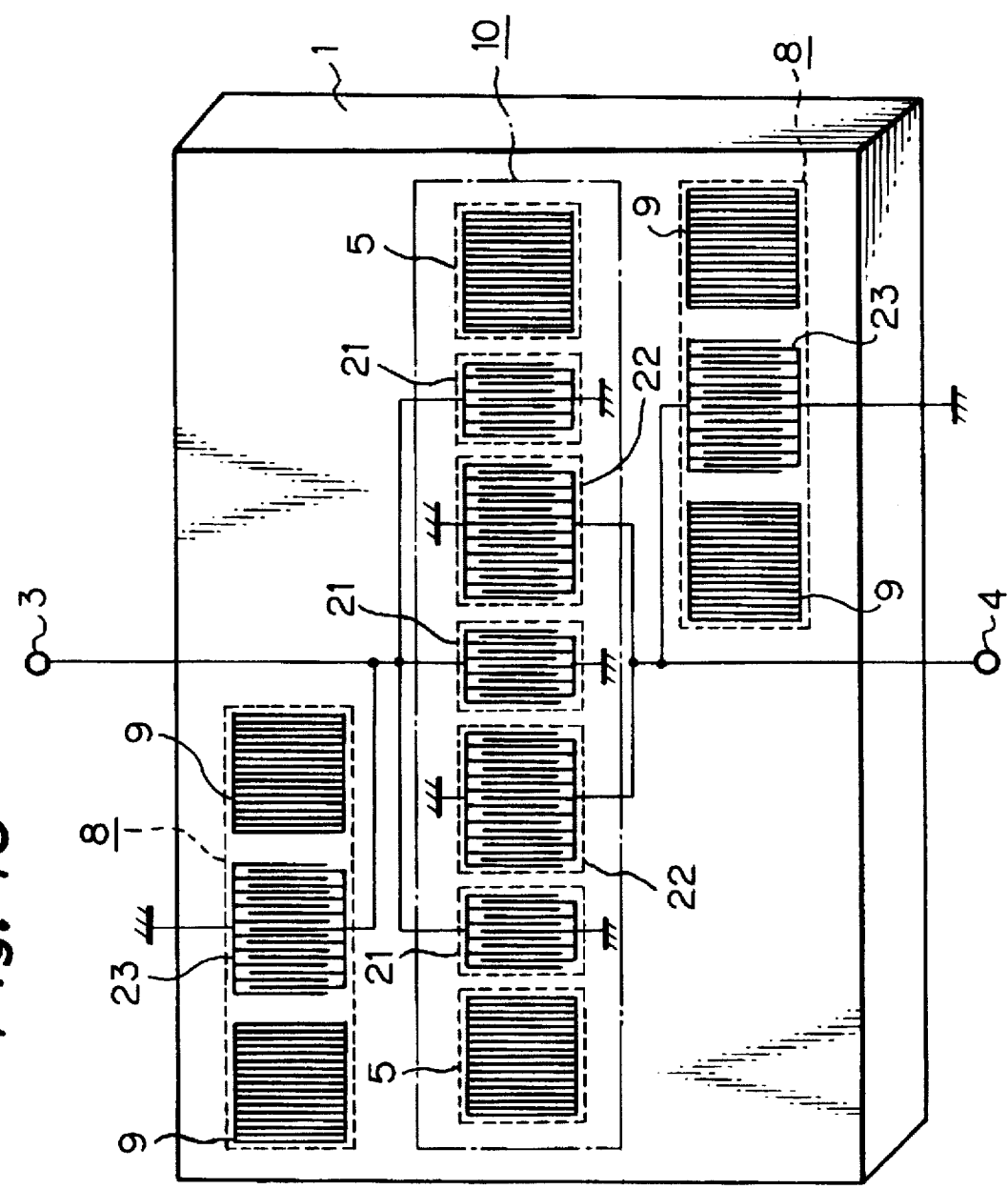
FIG. 16 illustrates a constitution of a SAW filter according to a third embodiment of the present invention.

Next will be an explanation of a third embodiment of the present invention. FIG. 16 illustrates a constitution of a SAW filter according to the third embodiment. In FIG. 16, all the reference numerals are identical to those of the second embodiment shown in FIG. 12, provided that a pair of terminals of each of the SAW resonators 8 in the third embodiment are respectively connected between the input or output terminal 3 or 4 and the ground, while the terminals of each of the SAW resonators 8 in second embodiment are respectively connected between the input or output terminal 3 or 4 and the input or output IDTs 21 or 22. Namely, in the SAW filter according to the third embodiment, the main filter part 10, which is identical to the SAW filter according to the first embodiment, is disposed on the LiTaO₃ piezoelectric substrate 1 of 36° Y cut and X axis propagation characteristic, and the SAW resonators 8, each of which includes the central IDT 23 and the reflectors 9, are connected in parallel with the input and output IDTs 21 and 22. That is, the respective pairs of terminals thereof are connected to the input and output terminals 3 and 4 and the ground.

Figure 17:
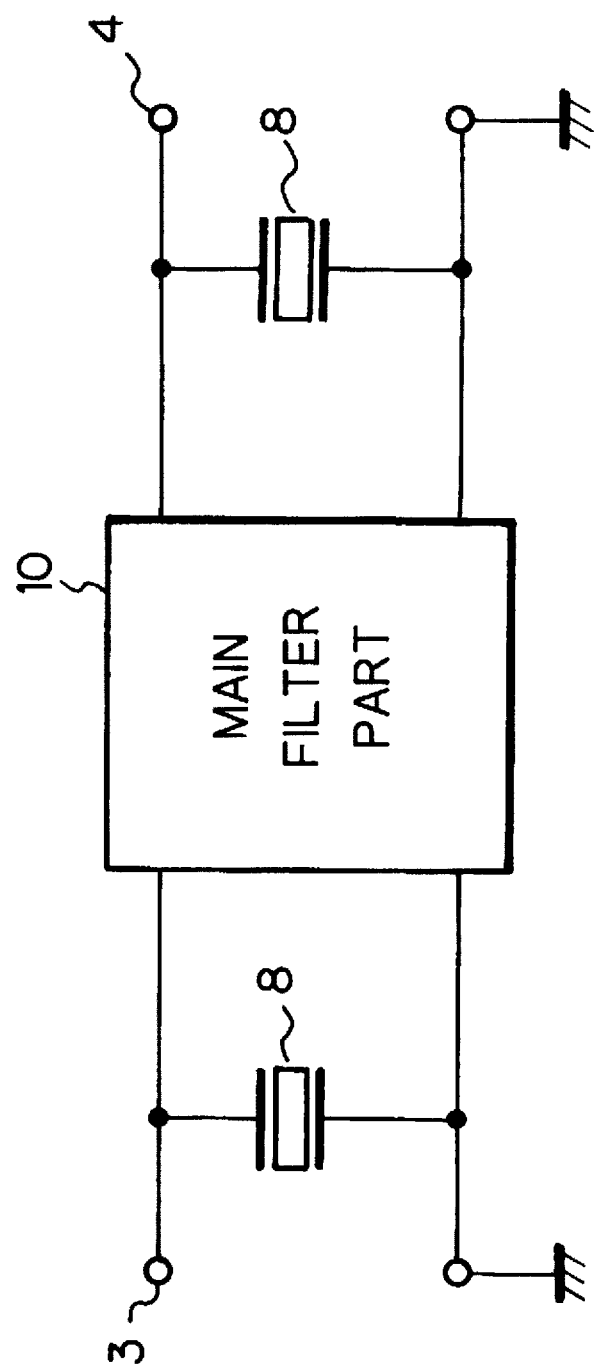
FIG. 17 is an explanatory sketch explaining a function of SAW resonators incorporated in the third embodiment shown in FIG. 16.

In the third embodiment, it is considered in view of the signal transmission route that each of the SAW resonators 8 forms a parallel circuit network having two terminal pairs wherein the respective terminal pairs are connected with the input terminal 3 and the ground and the output terminal 4 and the ground, as shown in FIG. 17, an electric signal having the anti-resonant frequency fa input to the input terminal 3 is subjected to pass to the output terminal 4 without substantial attenuation while an electric signal having the resonant frequency fr is subjected to grounded through the resonators 8 and substantially not to pass to the output terminal 4, resulting in attenuation extremity. Namely, it exhibits the attenuation characteristics as shown in FIG. 18(A).

Figure 18A:
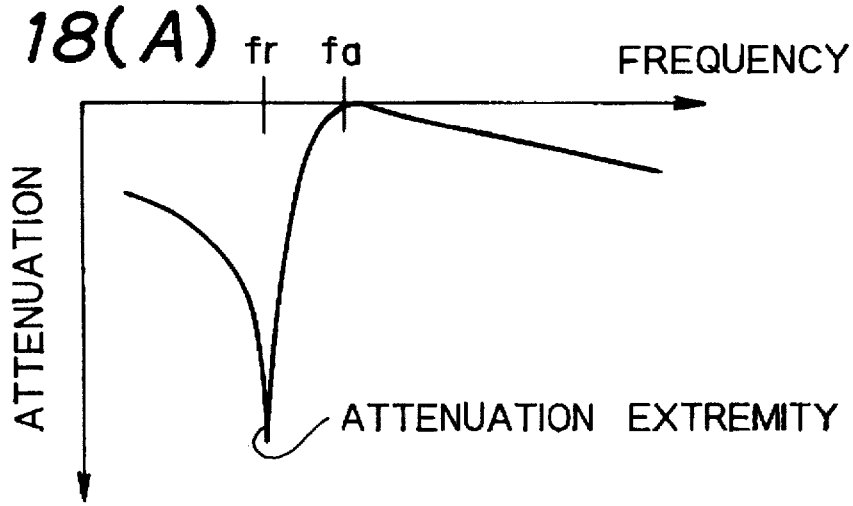
FIGS. 18(A)–18(C) are explanatory graphs explaining an operation of the third embodiment shown in FIG. 17, wherein FIGS. 18(A) and 18(B) respectively show attenuation characteristics of the SAW resonators and a main filter part of the third embodiment
Figure 18B:
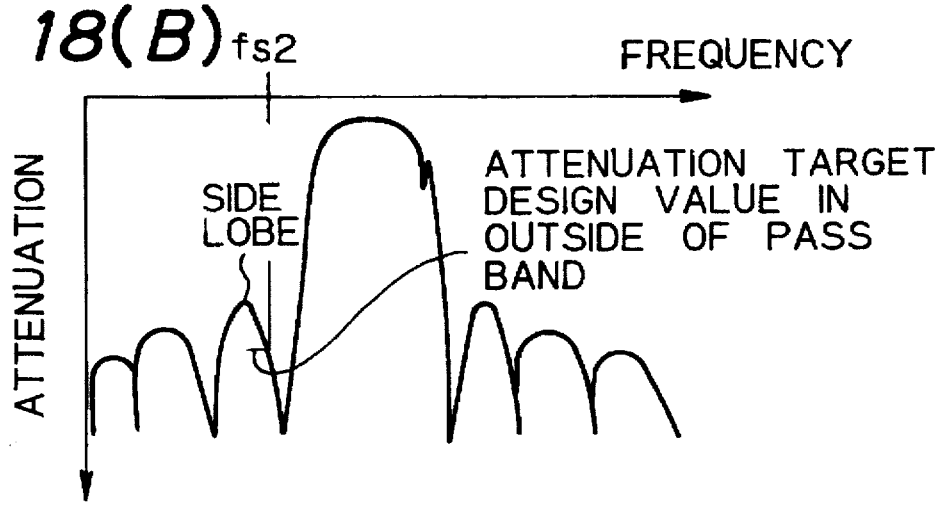

The main filter part 10 in the third embodiment has the same attenuation (or transmission) characteristics as in FIGS. 11(A) and 11(B) and as explained in connection with the first embodiment, and exhibits such attenuation characteristics as shown in FIG. 18(B) having the primary lower sidelobe at a frequency fs2 out of the pass band.

Figure 18C:
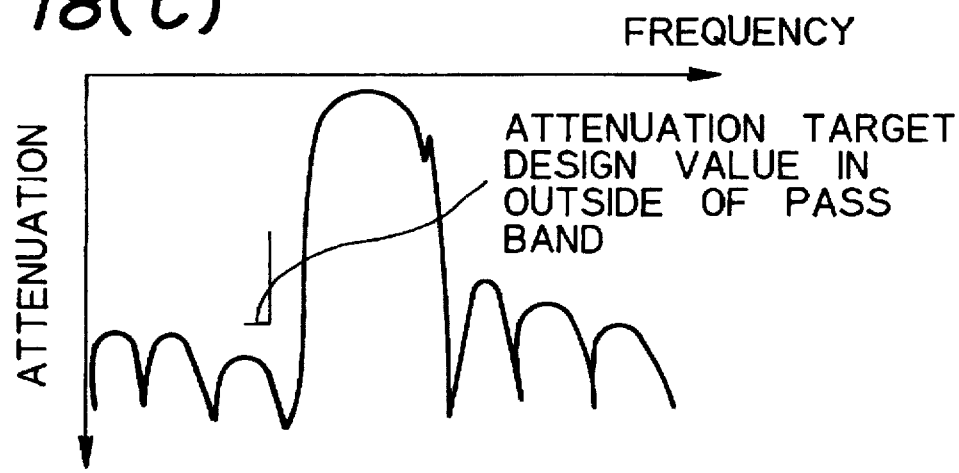

It is here to be noted that if the SAW resonators 8 and the main filter part 10 are so constituted that the resonant frequency fr in FIG. 18(A) and the frequency fs2 of the primary lower sidelobe in FIG. 18(B) are the same, the primary lower sidelobe will be suppressed by the attenuation extremity of the frequency fr as shown in FIG. 18(C) because the main filter part 10 and the SAW resonators 8 are connected in parallel. Accordingly, the attenuation in the lower side out of the pass band by the SAW filter will be made large.

At this relationship, since the anti-resonant frequency fa of the SAW resonators 8 is included in the pass band of the main filter part 10, the additional insertion loss in the pass band caused by inserting the resonators 8 will be small. Accordingly, the total insertion loss in the pass band of the third embodiment will be small as compared to the main filter part 10 being connected in multiple stages. It is obvious to any expert in this field that even if one of the resonators is deleted, similar operation and advantages will be obtained.

As explained above, according to the third embodiment of the present invention, a SAW filter exhibiting a large lower sidelobe attenuation characteristic, with maintaining a low insertion loss in a pass band, will be provided.

Figure 19:
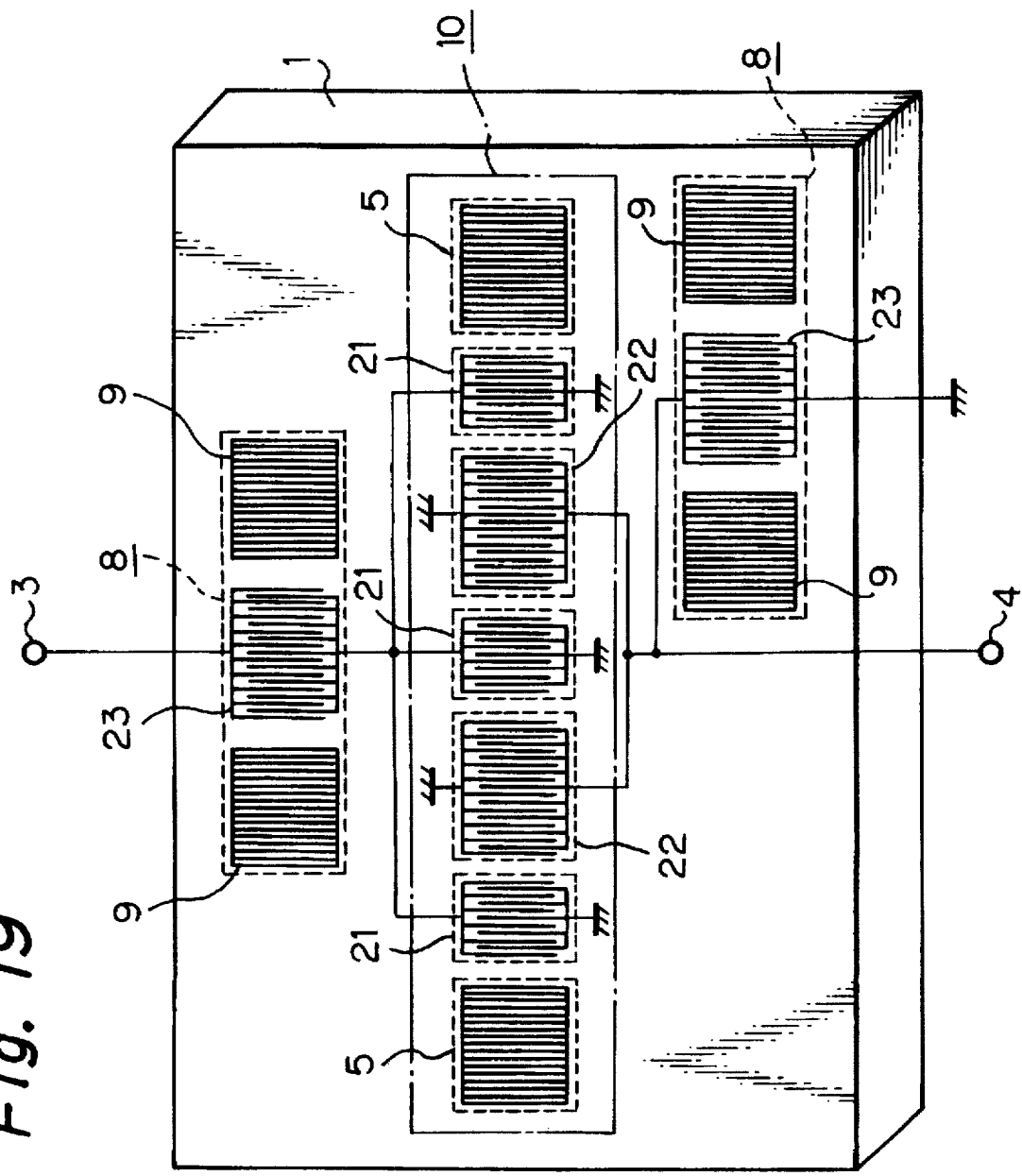
FIG. 19 illustrates a constitution of a SAW filter according to a fourth embodiment of the present invention.

FIG. 19 illustrates a constitution of a SAW filter in accordance with a fourth embodiment of the present invention. In FIG. 19, all the numerals are identical to those shown in FIG. 12 or 16, and however the SAW resonator 8 at the input side is connected as shown in FIG. 12 and the SAW resonator 8 at the output side is connected as shown in FIG. 16. Namely, in the fourth embodiment, the main filter part 10 are arranged on the LiTaO₃ piezoelectric substrate 1 of 36° Y cut and X axis propagation characteristic, each of the SAW resonators 8 is comprised of the central IDT 23 and the opposite side reflectors 5, and the SAW resonator 8 at the input side is connected between the input terminal 3 and the input IDTs 21 while the SAW resonator 8 at the output side is connected between the output terminal 4 and the ground. In other words, the SAW resonators at the input and output sides are connected in series and parallel with the input IDTs 21 and output IDTs 22 of the main filter part 10, respectively.

In the SAW filter according to the forth embodiment, the SAW resonator 8 positioned at the input side and connected in series with the input IDTs 21 exhibits such attenuation characteristics as shown in FIG. 14(A), as explained in connection with the second embodiment. On the other hand, the SAW resonator 8 positioned at the output side and connected in parallel to the output IDTs 22 exhibits such attenuation characteristics as shown in FIG. 18(A), as explained in connection with the third embodiment.

Figure 20A:
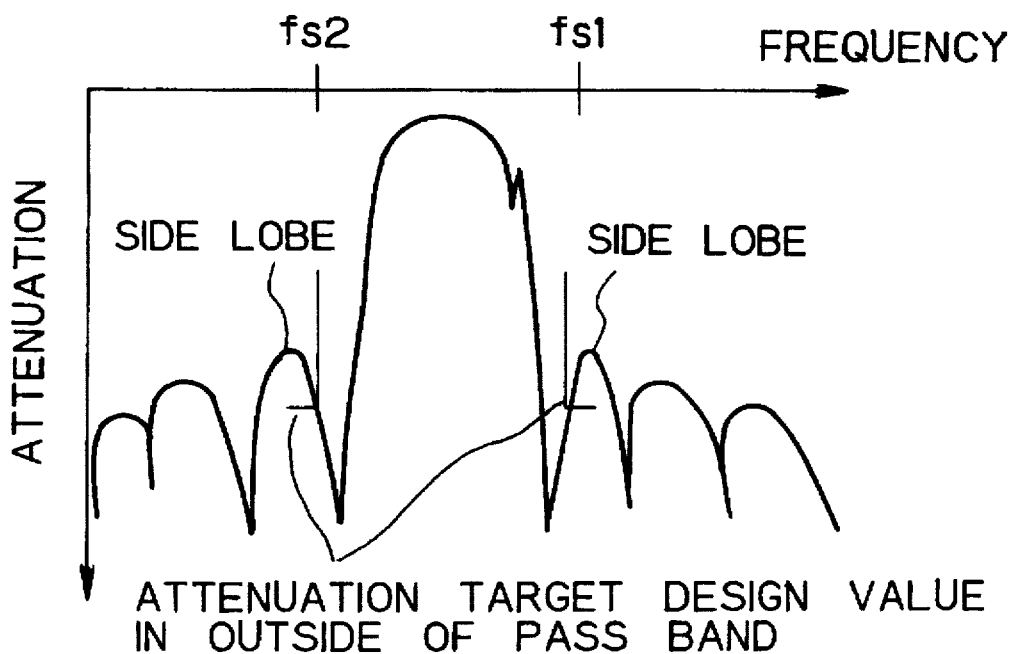
FIGS. 20(A) and 20(B) are explanatory diagrams explaining an operation of the fourth embodiment shown in FIG. 19, which respectively show attenuation characteristics of a main filter part and the whole fourth embodiment.

In the meantime, the main filter part 10 in the forth embodiment exhibits such attenuation characteristics as shown in FIG. 20(A) which are identical to those in FIGS. 14(B) and 18(B), and having the primary upper and lower sidelobes at the frequencies fs1 and fs2 outside of the pass band.

The SAW filter according to the fourth embodiment is further constituted such that the frequency fa of the attenuation extremity (see FIG. 14(A)) exhibited by the SAW resonator 8 at the input side and the frequency fs1 of the upper sidelobe (shown in FIG. 20(A)) exhibited by the main filter part 10 are substantially equal to suppress upper sidelobe by the attenuation extremity, and the frequency fr of the attenuation extremity (see FIG. 18(A)) exhibited by the SAW resonator 8 at the output side and the frequency fs2 of the lower sidelobe (shown in FIG. 20(A)) exhibited by the main filter part 10 are substantially equal to suppress the lower sidelobe by the attenuation extremity, as explained in connection with the second and third embodiments. The SAW filter according to the fourth embodiment is thus capable of exhibiting such a characteristic that the attenuation values outside the pass band are made large.

Furthermore, by setting that fa=fs1 and fr=fs2 as mentioned above, the resonant frequency fr of the SAW resonator 8 at the input side (see FIG. 14(A)) and the anti-resonant frequency fa of the SAW resonator 8 at the output side (see FIG. 18(A)) will be included in the pass band of the main filter part 10, and, therefore, the additional insertion loss in the pass band caused by inserting the SAW resonators 8 will be made small in comparison with the case where a plurality of main filter parts 10 are connected in a serial stage.

Figure 20B:
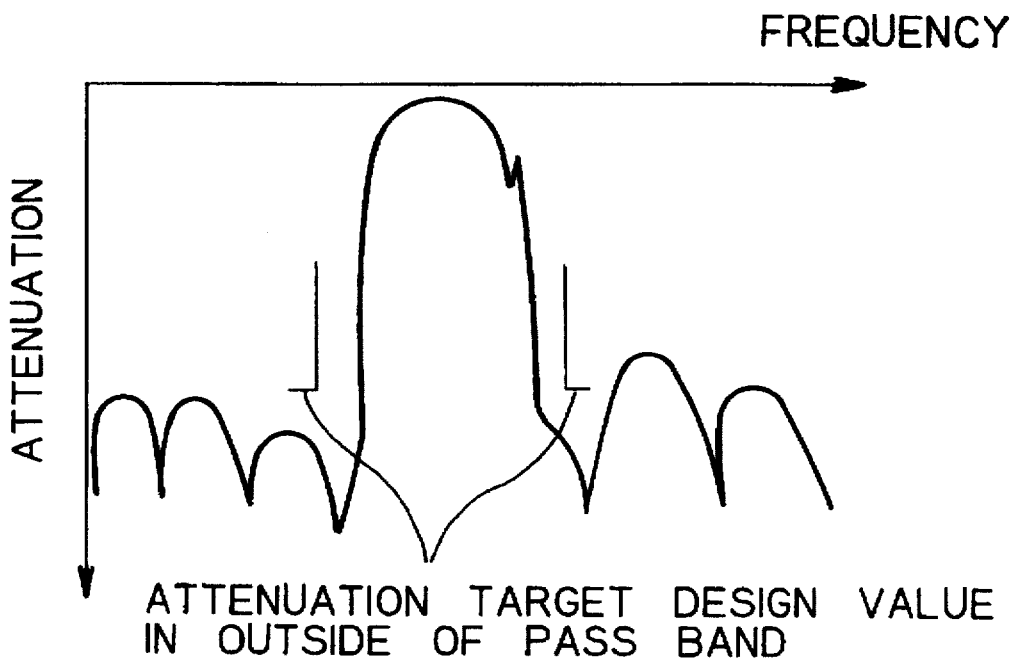

As explained above, the SAW filter according to the fourth embodiment is capable of exhibiting such attenuation characteristics as shown in FIG. 20(B), and thus having the low insertion loss in the pass band and the large attenuation characteristics in the outsides of the pass band.

Figure 21:
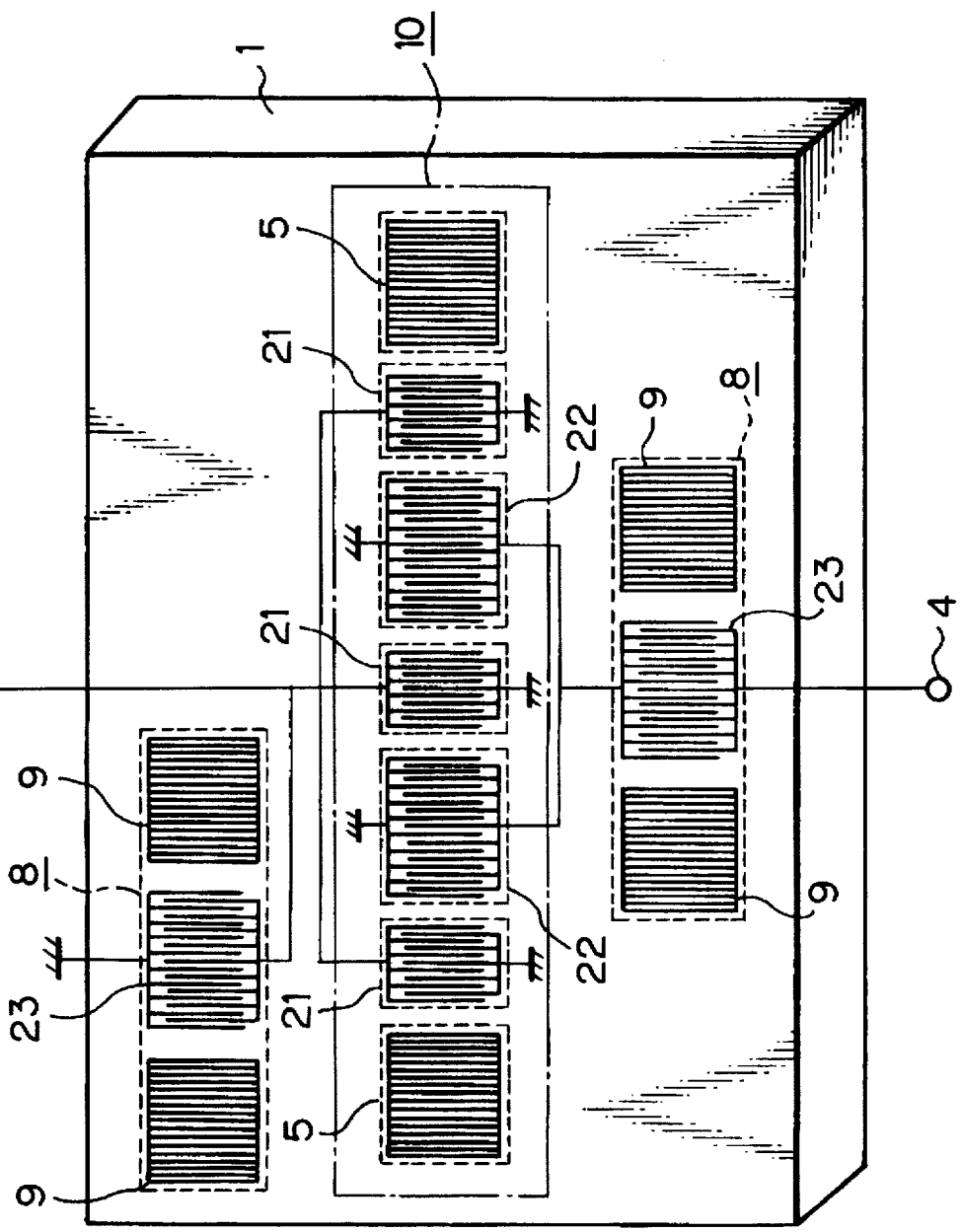
FIG. 21 illustrates a constitution of a SAW filter according to a fifth embodiment of the present invention.

FIG. 21 illustrates a constitution of a SAW filter according to a fifth embodiment of the present invention. In the fifth embodiment, the constitution is substantially the same as the fourth embodiment shown in FIG. 19, provided that on the contrary to the fourth embodiment, the SAW resonator 8 at the input side in the fifth embodiment is connected between the input terminal 3 and ground while the SAW resonator 8 at the output side in the fifth embodiment is connected between the output terminal 4 and the output IDTs 22 of the main filter part 10.

In the fifth embodiment, the main filter part 10 is exhibits such attenuation characteristics as shown in FIG. 20(A) (or FIG. 14(B) or 18(B)), and the SAW resonators 8 at the input and output sides are constituted to exhibit such attenuation characteristics as shown in FIGS. 18(A) and 14(A) explained in connection with the third and second embodiments, respectively. Further, in the fifth embodiment, the frequency fr of the attenuation extremity in FIG. 18(A) of the SAW resonator 8 at the input side is set to be equal to the frequency fs2 of the primary lower sidelobe (in FIG. 20(A)) of the main filter part 10 and the anti-resonant frequency fa of the attenuation extremity in FIG. 14(A) of the SAW resonator 8 at the output side is set to be equal to the frequency fs1 (in FIG. 20(A)) of the primary upper sidelobe.

Since the SAW resonator 8 at the input side and the input IDTs 21 of the main filter part 10 are connected in parallel to each other and the SAW resonator 8 at the output side and the output IDTs 22 of the main filter part 10 are connected in series to each other, the lower and upper sidelobes at the frequencies fs2 and fs1 of the main filter part 10 will be suppressed by the attenuation extremities at fr and fa, whereby the attenuation outside of the pass band will be made larger.

Furthermore, by the above constitution, since the anti-resonant frequency fa (in FIG. 18(A)) of the SAW resonator 8 at the input side and the resonant frequency fr (in FIG. 14(A)) are included within the pass band, the additional insertion lost in the pass band caused by inserting the SAW resonators 8 will not increase so much. Accordingly, the total insertion loss in the pass band will be made small as compared to the case in which the main filter parts 10 are connected at multiple stages. By the fifth embodiment, the attenuation characteristics as shown in FIG. 20(B) will be obtained, and thus a SAW filter having a low insertion loss in the pass band and large attenuation outside of the pass band will be provided similarly to the fourth embodiment of the present invention.

It has been explained that an $LiTaO_3$ piezoelectric substrate of 36° Y cut and X axis propagation characteristic is employed in the respective embodiments. However, other piezoelectric substrates may also be applied to the present invention, as long as a usable temperature range for a SAW filter is narrow or the requirement for a temperature coefficient of the piezoelectric substrate is not so strict.

Furthermore the number of the IDTs of the main filter part 10 is not limited to only five but also more than or equal to four in order to reduce an insertion loss in the pass band in comparison with a prior art in which three IDTs are utilized in the main filter part 10.

It is possible to exchange the input and output terminals 3 and 4 in the respective embodiments, in which case the attenuation characteristics of the initial SAW filter will naturally be retained. It is also possible to modify such that two SAW resonators 8 and the main filter part 10 are provided on different piezoelectric substrates or that the resonators 8 are instituted as discreet component(s).

According to the present invention, the following advantages will be derived:

Since the number of IDTs of the SAW filter or main filter part is more than or equal to four, the mutual conversion efficiency between electrical signals and SAWs may be enhanced. Furthermore, since the distance L between the opposing innermost electrode fingers of the IDTs has been selected to be in a range from 0.625 λ to 1.25 λ as shown in FIG. 10, the input and out impedances of the SAW filter will be almost 50 Ω, whereby the insertion loss in the pass band may be made small.

By selecting the number of IDTs to be odd numbers more than five, the mutual conversion efficiency between the electric signals and the SAWs may be enhanced, whereby the insertion loss in the pass band may be further reduced, and since the structures of the IDT group may be symmetric with the central IDT as the center, freedom in the design of the SAW filter may be so increased that the design may be made easier.

By connecting the input terminal and/or output terminal of the SAW filter with the input IDTs and/or output IDTs of the main filter part via resonator(s) connected there between, it is possible for the position (or frequency) of the attenuation extremity of the resonator(s) to superimpose on the position of the upper sidelobe occurred by the main filter part, whereby the attenuation in the upper side out of the pass band will be made larger. Further, by connecting the input terminal and/or output terminal of the SAW filter with the input IDTs and/or output IDTs via resonator(s) connected between the terminal(s) and ground, it is possible for the position of the attenuation extremity of the resonator(s) to be superimposed on the position of the lower sidelobe occurred by the main filter part, whereby the attenuation in the lower side out of the pass band will be made larger.

Furthermore, by connecting one of the input and output terminal of the SAW filter to a corresponding input or output IDTs of the main filter part via the resonator connected between the terminal and the ground, and by connecting the other terminal to the corresponding output or input IDTs via a resonator connected therebetween, it is possible for the positions of the attenuation extremities of the resonators to be superimposed on the lower and upper sidelobes respectively occurring in the main filter part, whereby attenuation in the lower and upper side out of the pass band will be made larger.

In addition to the above, by constituting the resonators as SAW resonators which consist of IDTs provided on a piezoelectric substrate and reflectors provided at the opposite sides of the IDTs on the substrate, it is possible to provide both the filter body and the resonators on the same piezoelectric substrate, whereby a SAW filter of a compact size may be obtained.

Furthermore by employing an LiTaO$_3$ piezoelectric substrate of 36° Y cut and X axis propagation characteristics as a relevant piezoelectric substrate, a SAW filter will have a small frequency variation depending on temperature, whereby it will be easier to design a pass band width.

Having described the present invention as related to the embodiments, it is further understood by those skilled in the art that other various changes and modifications may be made in this invention without departing from the spirit and scope thereof. For instance, the input and output impedances of the SAW filter may be set to other than 50 Ω on the basis of impedances of external circuits.

What is claimed is:

1. A surface acoustic wave (SAW) filter comprising:
   a piezoelectric substrate;
   at least four input and output interdigital transducers (IDTs) alternately aligned on said substrate in a SAW propagation direction and being respectively connected to input and output terminals of said SAW filter; and
   two reflectors positioned at the opposite sides of said IDTs on said substrate, wherein a distance between center lines of electrode fingers at the inner ends of the adjacent input and output IDTs is set to be within a range from 0.625 λ to 1.25 λ, where λ denotes a wave length of a resonant frequency of said SAW filter.

2. A SAW filter according to claim 1, wherein the number of said input and output IDTs is an odd number equal to or more than five.

3. A SAW filter according to claim 1, further comprising at least a resonator having a pair of terminals respectively connected to said input or output terminal of said SAW filter and said input or output IDTs.

4. A SAW filter according to claim 3, an anti-resonant frequency of said resonator is set to substantially the same as a frequency of a primary upper sidelobe of a main filter part comprising said IDTs and reflectors, whereby the primary upper sidelobe is suppressed.

5. A SAW filter according to claim 3, wherein said resonator is situated on said substrate and consists of an IDT and two reflectors at the opposite sides of the IDT.

6. A SAW filter according to claim 1, further comprising at least a resonator having a pair of terminals respectively connected to said input or output terminal of said SAW filter and ground.

7. A SAW filter according to claim 6, a resonant frequency of said resonator is set to be substantially the same as a frequency of a primary lower sidelobe of a main filter part comprising said IDTs and reflectors, whereby the primary lower sidelobe is suppressed.

8. A SAW filter according to claim 6, wherein said resonator is situated on said substrate and consists of an IDT and two reflectors at the opposite of the IDT.

9. A SAW filter according to claim 1, further comprising:
   a first resonator having a pair of terminals respectively connected to said input terminal of said SAW filter and said input IDTs; and
   a second resonator having a pair of terminals respectively connected to said output terminal of said SAW filter and ground.

10. A SAW filter according to claim 9, wherein an anti-resonant frequency of said first resonator is set to be substantially the same as a frequency of a primary upper sidelobe of a main filter part comprising said IDTs and reflectors, and a resonant frequency of said second resonator is set to be substantially the same as a frequency of a primary lower sidelobe of said main filter part, whereby the primary upper and lower sidelobes are suppressed.

11. A SAW filter according to claim 10, wherein each of said first and second resonators is constituted on said substrate and consists of an IDT and two reflectors at the opposite sides of the IDT.

12. A SAW filter according to claim 1, further comprising:
   a first resonator having a pair of terminals respectively connected to said output terminal of said SAW filter and said output IDTs; and
   a second resonator having a pair of terminals respectively connected to said input terminal of said SAW filter and ground.

13. A SAW filter according to claim 12, wherein an anti-resonant frequency of said first resonator is set to substantially the same as a frequency of a primary upper sidelobe of a main filter part comprising said IDTs and reflectors, and a resonant frequency of said second resonator is set to substantially the same as a frequency of a primary lower sidelobe of said main filter part, whereby the primary upper and lower sidelobes are suppressed.

14. A SAW filter according to claim 12, wherein each of said first and second resonators is situated on said substrate and consists of an IDT and two reflectors at the opposite sides of the IDT.

15. A SAW filter according to claim 1, wherein said substrate is made by LiTaO$_3$ having 36° Y cut and X axis SAW propagation characteristic.

* * * * *